(12) United States Patent
Imamura et al.

(10) Patent No.: US 9,989,602 B2
(45) Date of Patent: Jun. 5, 2018

(54) MAGNETIC RESONANCE IMAGING APPARATUS AND A POWER CONTROL METHOD OF A MAGNETIC RESONANCE IMAGING APPARATUS

(71) Applicant: TOSHIBA MEDICAL SYSTEMS CORPORATION, Otawara-Shi (JP)

(72) Inventors: Naoki Imamura, Nasushiobara (JP); Motohisa Yokoi, Nasushiobara (JP); Kazuyuki Soejima, Nasushiobara (JP); Motohiro Miura, Yaita (JP); Sho Kawajiri, Nasushiobara (JP); Haruki Nakamura, Nasushiobara (JP)

(73) Assignee: TOSHIBA MEDICAL SYSTEMS CORPORATION, Otawara-Shi, Tochigi-Ken (JP)

( * ) Notice: Subject to any disclaimer, the term of this patent is extended or adjusted under 35 U.S.C. 154(b) by 1163 days.

(21) Appl. No.: 14/068,385

(22) Filed: Oct. 31, 2013

(65) Prior Publication Data
US 2014/0070809 A1 Mar. 13, 2014

Related U.S. Application Data

(63) Continuation of application No. PCT/JP2013/072718, filed on Aug. 26, 2013.

(30) Foreign Application Priority Data

Sep. 10, 2012 (JP) .................................. 2012-198796

(51) Int. Cl.
*G01R 33/36* (2006.01)
(52) U.S. Cl.
CPC .................................... *G01R 33/36* (2013.01)

(58) Field of Classification Search
CPC ........ G01R 1/22; G01R 15/18; G01R 15/183; G01R 15/181; G01R 31/25;
(Continued)

(56) References Cited

U.S. PATENT DOCUMENTS 5,867,561 A * 2/1999 Strasser .................... H05G 1/30
378/101
6,215,309 B1 * 4/2001 Rzedzian ........... G01R 33/3852
324/318

(Continued)

FOREIGN PATENT DOCUMENTS

JP 61-285518 12/1986
JP 07-255692 10/1995

(Continued)

OTHER PUBLICATIONS

Supplementary European Search Report dated May 12, 2016 in EP 13782929.7.

(Continued)

*Primary Examiner* — Dixomara Vargas
(74) *Attorney, Agent, or Firm* — Nixon & Vanderhye P.C.

(57) ABSTRACT

An MRI apparatus includes a data acquisition system, a charge/discharge element and a power control unit. The data acquisition system acquires nuclear magnetic resonance signals from an imaging region by performing a scan. The charge/discharge element is a part of an electric power system of the MRI apparatus, and is charged with external electric power. The power control unit controls the electric power system in such a manner that at least one unit excluding the data acquisition system is supplied with electric power from the charge/discharge element.

20 Claims, 10 Drawing Sheets

(58) Field of Classification Search
CPC .............. G01R 19/0076; G01R 31/025; G01R 31/245; G01R 33/4828; G01R 33/5611; G01R 33/565; G01R 33/3415; G01R 33/561; G01R 33/56; G01R 33/54; G01R 33/4833; G01R 33/34046; G01R 33/34; G01R 33/36; H01F 38/30; H01J 9/42; G03G 15/0545; G03G 15/054; G03G 13/22; H05G 1/10; H05G 1/06; H05G 1/54; H05G 1/20; H05G 1/24; H05G 1/34
USPC .................. 378/32, 101, 103, 109, 111, 114; 324/127

See application file for complete search history.

(56) References Cited

U.S. PATENT DOCUMENTS

| | | | | |
|---|---|---|---|---|
| 6,479,997 | B1* | 11/2002 | Westhphal | G01R 33/3852 324/318 |
| 6,946,836 | B2* | 9/2005 | Kuhara | G01R 33/5611 324/307 |
| 7,224,143 | B2* | 5/2007 | Liscio | A61B 5/0046 320/114 |
| 7,298,602 | B2* | 11/2007 | Knight | G01R 33/3815 361/141 |
| 7,414,382 | B2* | 8/2008 | Liscio | A61B 5/0046 320/107 |
| 7,928,600 | B2* | 4/2011 | Hishikawa | G01R 33/3614 307/17 |
| RE42,611 | E* | 8/2011 | Liscio | A61B 5/0046 320/103 |
| 8,749,094 | B2* | 6/2014 | Huisman | G01R 33/3852 307/49 |
| 8,907,672 | B2* | 12/2014 | Hori | G01R 33/3852 324/307 |
| 9,106,154 | B2* | 8/2015 | Heuermann | G01R 33/3852 |
| 9,283,397 | B2* | 3/2016 | Stancer | A61N 1/3956 |
| 9,549,687 | B2* | 1/2017 | Georgiev | A61B 5/0555 |
| 9,726,734 | B2* | 8/2017 | Hori | G01R 33/28 |
| 9,759,790 | B2* | 9/2017 | Kawajiri | A61B 5/055 |
| 2005/0028014 | A1* | 2/2005 | Allred | H02J 3/14 713/300 |
| 2010/0045113 | A1 | 2/2010 | Hishikawa et al. | |
| 2010/0172159 | A1 | 7/2010 | Kyono | |
| 2011/0206272 | A1 | 8/2011 | Takaichi et al. | |
| 2011/0210739 | A1* | 9/2011 | Ham | G01R 33/28 324/318 |
| 2011/0249800 | A1 | 10/2011 | Sung et al. | |
| 2013/0147485 | A1 | 6/2013 | Yokoi | |
| 2013/0181638 | A1* | 7/2013 | Komatsu | A61B 6/0457 318/3 |

FOREIGN PATENT DOCUMENTS

| | | |
|---|---|---|
| JP | 10-510135 | 9/1998 |
| JP | 11-99145 | 4/1999 |
| JP | 2005-57997 | 3/2005 |
| JP | 2008-104760 | 5/2008 |
| JP | 2009-178375 | 8/2009 |
| JP | 2009-240526 | 10/2009 |
| JP | 2011-176927 | 9/2011 |
| JP | 2012-040206 | 3/2012 |
| JP | 2012-040206 A | 3/2012 |
| JP | 2012-050507 | 3/2012 |
| WO | WO 96/17260 | 6/1996 |

OTHER PUBLICATIONS

Supplementary European Search Report dated May 13, 2016 in EP 13782930.5.
English Translation of International Preliminary Report on Patentability dated Mar. 10, 2015 for Application No. PCT/JP2013/072717.
International Search Report for PCT/JP2013/072717, dated Sep. 17, 2013.
English Translation of International Preliminary Report on Patentability dated Mar. 10, 2015 for Application No. PCT/JP2013/072718.
International Search Report for PCT/JP2013/072718, dated Sep. 17, 2013.

* cited by examiner

MAGNETIC RESONANCE IMAGING APPARATUS AND A POWER CONTROL METHOD OF A MAGNETIC RESONANCE IMAGING APPARATUS

CROSS-REFERENCE TO RELATED APPLICATIONS

This application is a Continuation Application of No. PCT/JP2013/72718, filed on Aug. 26, 2013, and the PCT application is based upon and claims the benefit of priority from Japanese Patent Application No. 2012-198796, filed on Sep. 10, 2012, the entire contents of which are incorporated herein by reference.

BACKGROUND OF THE INVENTION

1. Field of the Invention

The Embodiments of the present invention relate to a magnetic resonance imaging apparatus and a power control method of a magnetic resonance imaging apparatus.

2. Description of the Related Art

MRI is an imaging method which magnetically excites nuclear spin of an object set in a static magnetic field with an RF pulse having the Larmor frequency and reconstructs an image on the basis of MR signals generated due to the excitation. The aforementioned MRI means magnetic resonance imaging, the RF pulse means a radio frequency pulse as an excitation pulse, and the MR signal means a nuclear magnetic resonance signal.

In recent years, high-speed imaging technology is promoted as represented by EPI (Echo Planar Imaging) and so on. When high-speed imaging such as EPI is performed, high output power is required in units of an imaging system such as an amplifier in an RF pulse transmitter and a gradient magnetic field power supply.

In an MRI apparatus, the electric power consumed in imaging is supplied from an external commercial power source. Thus, in order to enable the above high-speed imaging, i.e. in order to enable sufficient output, the maximum consumed power in the case of performance of the high-speed imaging, a power-supply facility of an MRI apparatus has been growing in size.

Incidentally, as conventional technology regarding power sources of a medical image generation system such as an MRI apparatus, the uninterruptible power source described in Patent Document 1 is known.

[Patent Document 1] Japanese Unexamined Patent Application Publication (Translation of PCT Application) No. 10-510135

If a power-supply facility of an MRI apparatus grows in size, it causes not only increase in facility expense but also restriction in site design. Concretely speaking, more restrictions are imposed on arranging methods of respective components of an MRI apparatus in an examination room and a computer room.

Therefore, in MRI, a novel technology to downsize a power-supply facility without decreasing the maximum consumed power has been desired.

DETAILED DESCRIPTION

In order to downsize a power-supply facility without decreasing the maximum consumed power, the inventors have worked out a structure of a hybrid-type MRI apparatus. This MRI apparatus includes a charge/discharge element charged with external electric power which is externally supplied. This MRI apparatus consumes the accumulated electric power of the charge/discharge element, when the MRI apparatus runs short of the electric power beyond the external electric power during implementation term of imaging. Note that, the above charge/discharge element means a circuit element that can be repeatedly charged and discharged, like a capacitor and a secondary battery such as a lithium-ion rechargeable battery and a nickel hydride rechargeable battery.

Hereinafter, examples of aspects which embodiments of the present invention can take will be explained per aspect.

(1) According to one embodiment of the present invention, an MRI apparatus includes a data acquisition system, a charge/discharge element and a power control unit.

The data acquisition system performs a scan including application of a gradient magnetic field and transmission of an RF pulse to an imaging region, so as to acquire an MR signal from the imaging region.

The charge/discharge element is a part of an electric power system of the magnetic resonance imaging apparatus, and is charged with external electric power.

The power control unit controls the electric power system in such a manner that at least one unit excluding the data acquisition system is supplied with electric power from the charge/discharge element.

(2) In another embodiment of the present invention, a power control method of an MRI apparatus is a method which charges an charge/discharge element being a part of an electric power system of the MRI apparatus with external electric power and controls the electric power system in such a manner that at least one unit excluding the data acquisition system is supplied with electric power from the charge/discharge element.

In the following, some examples of embodiments of a hybrid type MRI apparatus and a power control method of a hybrid type MRI apparatus will be described with reference to the accompanying drawings. Note that the same reference numbers are given for identical components in each figure, and overlapping explanation is abbreviated.

<The First Embodiment>

Figure 1:
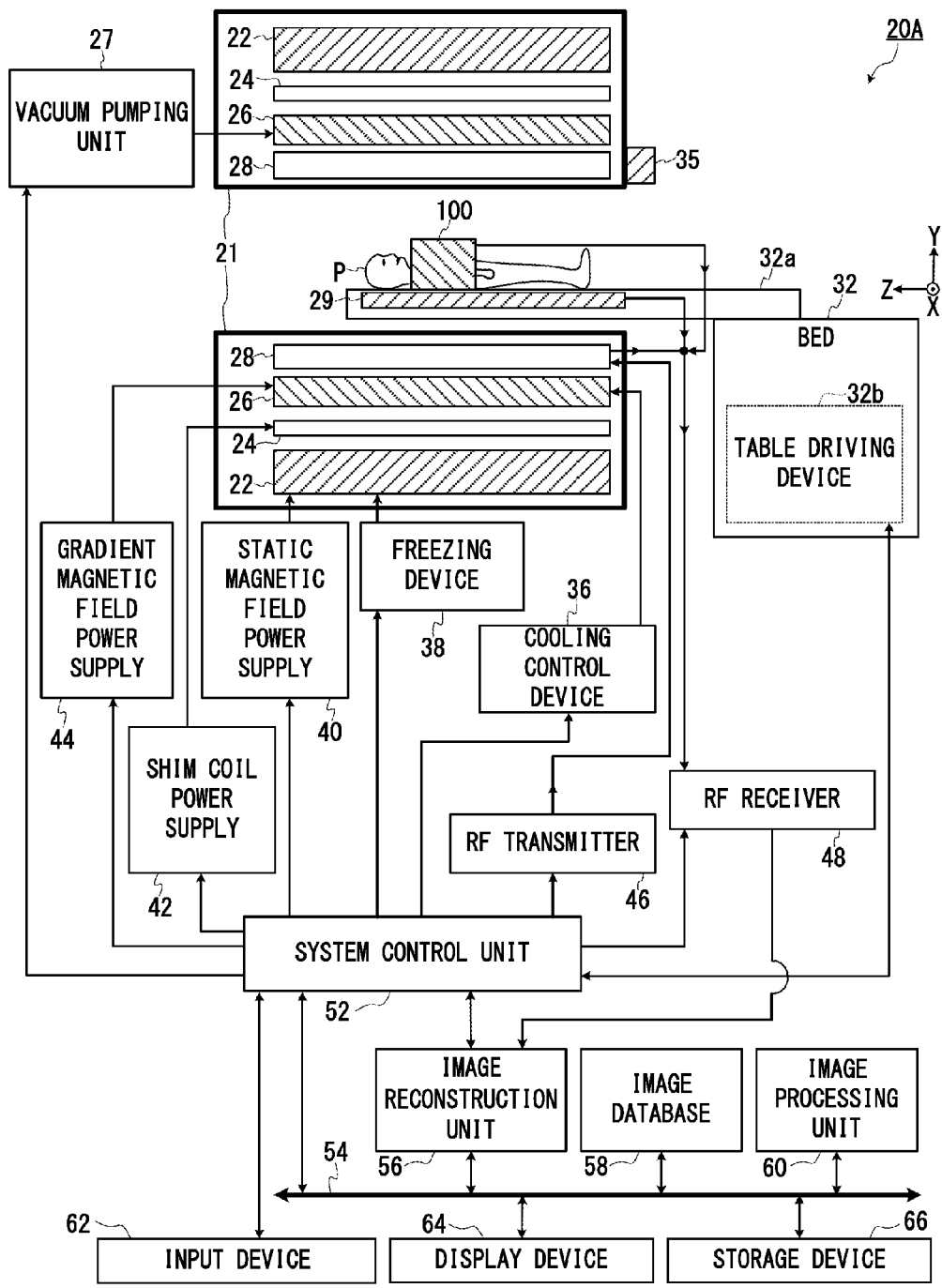
FIG. 1 is a functional block diagram mainly showing the structure of an imaging system in the MRI apparatus of the first embodiment.

FIG. 1 is a functional block diagram showing the general structure of the imaging system of the MRI apparatus 20A of the first embodiment. As shown in FIG. 1, the MRI apparatus 20A includes a gantry 21, a bed 32 and a projector 35.

The bed 32 includes a table 32a and a table driving device 32b which moves the table 32a in a predetermined direction. The table 32a is movably supported by the bed 32. An object P is loaded on the table 32a.

The projector 35 is disposed on the portion of the opening of the gantry 21, and irradiates light for positioning towards the table 32a.

In addition, the MRI apparatus 20A includes a static magnetic field magnet 22, a shim coil 24, a gradient magnetic field coil 26, a transmission RF coil 28, a reception RF coil 29, a static magnetic field power supply 40, a shim coil power supply 42, a gradient magnetic field power supply 44, an RF transmitter 46, an RF receiver 48 and a system control unit 52, as a data collecting system.

In addition, the MRI apparatus 20A includes a system bus 54, an image reconstruction unit 56, an image database 58 and an image processing unit 60, as a data processing system.

The imaging system consisting of the above data collecting system and the data processing system performs magnetic resonance imaging by consuming the external electric power supplied from an external electric power source, and thereby image data of the object P are generated.

Moreover, the MRI apparatus 20A includes an input device 62, a display device 64 and a storage device 66.

Note that, the system bus 54, the image reconstruction unit 56, the image database 58, the image processing unit 60, the input device 62, the display device 64 and a storage device 66 may be composed as one computer (after-described computer system 312)

The static magnetic field magnet 22, the shim coil 24, the gradient magnetic field coil 26 and the transmission RF coil 28 are disposed in the gantry 21.

The static magnetic field magnet 22 and the shim coil 24 are, for example, cylinder-shaped, and the shim coil 24 is coaxially arranged inside the static magnetic field magnet 22.

As an example here, an apparatus coordinate system, whose X axis, Y axis and Z axis are perpendicular to each other, is defined as follows.

Firstly, it is assumed that the static magnetic field magnet 22 and the shim coil 24 are disposed in such a manner that their axis direction is perpendicular to the vertical direction, and the Z axis direction is defined as the direction of an axis of the static magnetic field magnet 22 and the shim coil 24. In addition, it is assumed that the vertical direction is the same as the Y axis direction. Moreover, the table 32a is disposed in such a position that the direction of the normal line of its loading plane is the same as the Y axis direction.

The static magnetic field magnet 22 forms a static magnetic field magnet in an imaging space with the use of an electric current supplied from the static magnetic field power supply 40. The aforementioned imaging space means, for example, a space in the gantry 21 in which the object P is placed and to which a static magnetic field is applied.

As an example here, the static magnetic field magnet 22 is composed of superconductivity coils. However, the static magnetic field magnet 22 may be composed of a permanent magnet which makes the static magnetic field power supply 40 unnecessary.

The shim coil 24 is electrically connected to the shim coil power supply 42 and uniforms the static magnetic field with the electric current supplied from the shim coil power supply 42.

The gradient magnetic field coil 26 is, for example, arranged inside the static magnetic field magnet 22 in the form of a cylinder. The gradient magnetic field coil 26 generates a gradient magnetic field Gx in the X axis direction, a gradient magnetic field Gy in the Y axis direction and a gradient magnetic field Gz in the Z axis direction in the imaging region, by using electric current supplied from the gradient magnetic field power supply 44. That is, directions of "a gradient magnetic field Gss in a slice selection direction", a gradient magnetic field Gpe in a phase encoding direction and "a gradient magnetic field Gro in a readout (frequency encoding) direction" can be arbitrarily set as logical axes, by combining the gradient magnetic fields Gx, Gy and Gz in the three axes of the apparatus coordinate system.

Incidentally, the above imaging region means, for example, a region set as a part of the imaging space and is a range of acquisition of MR signals used to generate one image or one set of images. The one set of images means, for example, a plurality of images when MR signals of the plurality of images are acquired in a lump in one pulse sequence such as multi-slice imaging. The imaging region is defined three-dimensionally in the apparatus coordinate system, for example.

The RF transmitter 46 generates RF pulses (RF pulse electric current) of the Larmor frequency for causing nuclear magnetic resonance in accordance with control information provided from the system control unit 52, and transmits the generated RF pulses to the transmission RF coil 28. The transmission RF coil 28 receives the RF pulses from the RF transmitter 46, and transmits the RF pulses to the object P.

Note that, the transmission RF coil 28 includes "a whole body coil (not shown) which is built-in the gantry 21 and used for both transmission of the RF pulses and detection of MR signals.

A reception RF coil 29 is disposed inside the table 34. The reception RF coil 29 detects MR signals generated due to excited nuclear spin inside the object P by the RF pulse, and transmits the detected MR signals to the RF receiver 48.

Note that, as an example in FIG. 1, though the wearable type RF coil device 100 for local detection of the MR signals is set on the object P, the wearable type RF coil device 100 is not a requisite element. Alternatively, for example, like a head part RF coil device set on the head part of the object P, an RF coil device of local transmission and detection (not shown), which has dual role of transmitting RF pulses and detecting the MR signals, may be used. As an example here, it is assumed that these RF coil devices (100) are a part of the MRI apparatus 20A, and the consumed power of these RF coil devices (100) are supplied from the electric power system of the MRI apparatus 20A. However, an RF coil device may be interpreted as a component separated from the MRI apparatus 20A.

The RF receiver 48 generates complex number data of digitized MR signals (hereinafter, referred to as raw data of MR signals) by performing predetermined signal processing on the MR signals detected by these reception RF coil 29 and the wearable type RF coil device 100 and then performing A/D (analog to digital) conversion on them. The RF receiver 48 inputs the generated raw data of MR signals to the image reconstruction unit 56.

The image reconstruction unit 56 generates k-space data on the basis of the raw data of MR signals inputted from the RF receiver 48, and stores the k-space data. The k-space means a frequency space (Fourier space). In the case of a two dimensional imaging, the above k-space data are, for example, matrix data whose horizontal and vertical element numbers are the phase encode step number and the frequency encode step number, and the k-space data are respectively generated for the real number part and the imaginary number part. The image reconstruction unit 56 generates image data of the object P by performing image reconstruction processing including such as two-dimensional Fourier transformation on the k-space data. The image reconstruction unit 56 stores the generated image data in the image database 58.

The image processing unit 60 takes in the image data from the image database 58, performs predetermined image processing on them, and stores the image data after the image processing in the storage device 66 as display image data.

The storage device 66 stores the display image data after adding accompanying information such as the conditions of the imaging sequence used for generating the display image data and information of the object P (patient information) to the display image data.

The display device 64 displays a screen for setting the conditions of the imaging sequence and images indicated by the generated image data in accordance with control of the system control unit 52.

The system control unit 52 performs system control of the entirety of the MRI apparatus 20A in imaging operation and image display after imaging operation via interconnection lines such as the system bus 54.

For the sake of achieving the above control, the system control unit 52 stores control information needed in order to make the gradient magnetic field power supply 44, the RF transmitter 46 and the RF receiver 48 drive. The aforementioned control information includes, for example, sequence information describing operation control information such as intensity, application period and application timing of the pulse electric currents which should be applied to the gradient magnetic field power supply 44.

The system control unit 52 generates the gradient magnetic fields Gx, Gy and Gz and RF pulses by driving the gradient magnetic field power supply 44, the RF transmitter 46 and the RF receiver 48 in accordance with a predetermined imaging sequence stored.

In addition, the system control unit 52 makes the table 32a move into and out of the imaging space in the gantry 21 in the Z axis direction by controlling the table driving device 32b. In addition, the system control unit 52 can control the table driving device 32b so as to move up and down the table 32a in the Y axis direction. The system control unit 52 locates the imaging part of the object P near to the center of the magnetic field in the imaging space by controlling the position of the table 32a in the above manner.

In addition, the system control unit 52 functions as a condition setting unit of imaging sequences. That is, the system control unit 52 sets all the conditions of the imaging sequences on the basis of some of the conditions of the imaging sequences and information on the object P inputted to the input device 62 by a user. For the sake of achieving this, the system control unit 52 makes the display device 64 display screen information for setting conditions of imaging sequences.

The input device 62 provides a user with a function to set conditions of imaging sequences and image processing conditions.

The aforementioned term conditions of imaging sequences refers to under what condition an RF pulse or the like is transmitted in what type of pulse sequence, and under what condition MR signals are acquired from the object P as a main scan, for example.

As examples of conditions of an imaging sequence, for example, there are the imaging region as positional information in the imaging space, an imaging part, the type of the pulse sequence such as parallel imaging, the type of RF coil devices used for imaging, the number of slices, an interval between respective slices and so on.

The above imaging part means, for example, a region of the object P to be imaged as an imaging region, such as a head, a chest and an abdomen.

The aforementioned main scan is a scan for imaging an intended diagnosis image such as a proton density weighted image, and it does not include a scan for acquiring MR signals for a scout image or a calibration scan.

A scan is an operation of acquiring MR signals, and it does not include image reconstruction processing.

The calibration scan is, for example, a scan for determining unconfirmed elements of conditions of the main scan, conditions and data used for image reconstruction processing and so on, and it is performed separately from the main scan. A prescan is a calibration scan which is performed before the main scan (for example, at the timing of Step S1 in the later-described FIG. 4).

The MRI apparatus 20A further includes a vacuum pumping unit 27, a cooling control device 36, and a freezing device 38.

The vacuum pumping unit 27 reduces noise caused by vibration of the gradient magnetic field coil 26, by vacuumizing the surrounding areas of the gradient magnetic field coil 26. Concretely speaking, inside the gantry 21, the surrounding areas of the gradient magnetic field coil 26 are configured as an enclosed space, and the vacuum pumping unit 27 hushes it by vacuuming up the air in this enclosed space.

The cooling control device 36 cools down the gradient magnetic field coil 26 and the transmission RF coil 28 inside the gantry 21 by circulating a cooling medium in cooling pipes in the gantry 21.

The freezing device 38 cools down the static magnetic field magnet 22 on a steady basis by using, for example, liquid helium.

Figure 2:
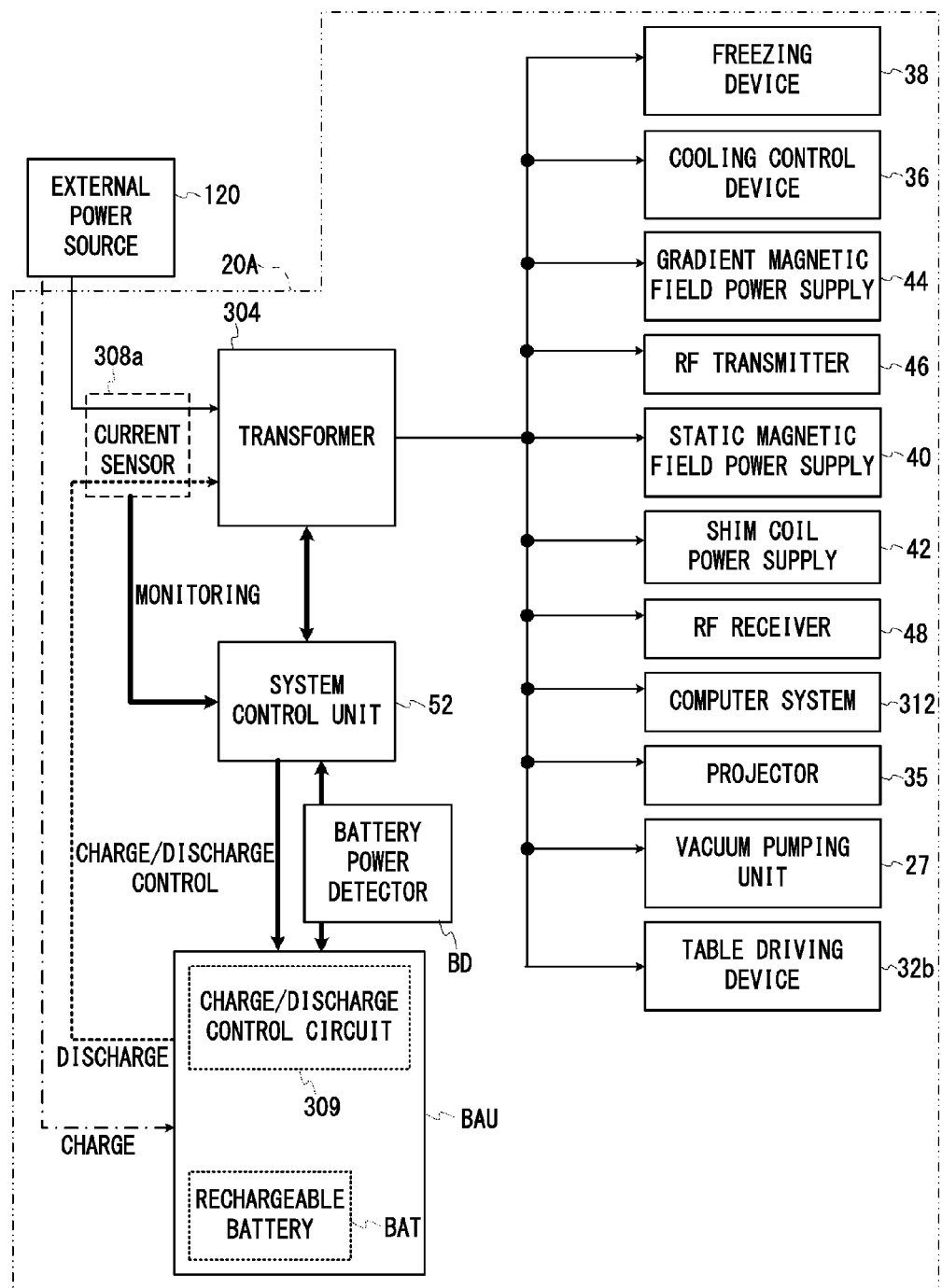
FIG. 2 is a block diagram showing a power supply system of the MRI apparatus of the first embodiment.

FIG. 2 is a block diagram showing the power supply system of the MRI apparatus 20A of the first embodiment. In FIG. 2, the MRI apparatus 20A further includes a transformer 304, a current sensor 308a, a battery unit BAU, and a battery power detector BD.

In FIG. 2, the external power source 120 is, for example, a commercial power source. The external electric power supplied from the external power source 120 is provided to the transformer 304 of the MRI apparatus 20A.

The computer system 312 in FIG. 2 corresponds to input device 62, the display device 64, the storage device 66, and the data processing system including the system bus 54, the image reconstruction unit 56, the image database 58, the image processing unit 60 and so on (see FIG. 1).

Although the RF coil device 100 is not shown in FIG. 2 for the sake of avoiding complication, as an example here, it is assumed that the electric power for the RF coil device 100 is supplied from the transformer 304 in the way similar to each unit of the data acquisition system such as the RF transmitter 46.

The battery unit BAU includes a charge/discharge control circuit 309 and a rechargeable battery BAU. The charge/discharge control circuit 309 controls discharge and charge of the rechargeable battery BAU in accordance with the control of the system control unit 52. That is, the charge/discharge control circuit 309 switches the state of the rechargeable battery BAU to one of the standby condition in which discharge or charge is not performed, the charging condition and the discharging condition.

Under the charging condition, the rechargeable battery BAU receives the external electric power supplied from the external power source 120 via the charge/discharge control circuit 309, and thereby the rechargeable battery BAU is charged. Concretely speaking, when the charging voltage of the rechargeable battery BAU is below the voltage at completion of charging, the charge/discharge control circuit 309 supplies the external electric power to the rechargeable battery BAU as an charging current in accordance with the control of the system control unit 52.

The rechargeable battery BAU is, for example, a lithium-ion rechargeable battery, but it may be the aforementioned other charge/discharge element. For example, when the consumed power of the MRI apparatus 20A is so large as to run short of the electric power beyond the external electric power, the rechargeable battery BAU supplies a discharging current as a part of an excitation current flowing the primary winding of the transformer 304. That is, the rechargeable battery BAU supplies a part of the consumed power of the MRI apparatus 20A by discharging the accumulated electric power.

The battery power detector BD measures the charging voltage of the rechargeable battery BAU, and inputs the measured value to the system control unit 52.

The transformer 304 includes the primary winding, and a plurality of secondary windings which are respectively magnetically coupled to the primary winding. The transformer 304 supplies the external electric power to its primary winding as an excitation current. The transformer 304 generates the induced currents in the secondary windings by the excitation current flowing the primary winding.

Each unit of the secondary side of the transformer 304 receives the induced current as source of electrical energy, and performs magnetic resonance imaging by consuming the received electric power. Each unit of the secondary side means the freezing device 38, the cooling control device 36, the gradient magnetic field power supply 44, the RF transmitter 46, the static magnetic field power supply 40, the shim coil power supply 42, the RF receiver 48, the computer system 312, the projector 35, the vacuum pumping unit 27, and the table driving device 32b in the example of FIG. 2. For example, each unit of the secondary side respectively corresponds to one of the aforementioned plurality of the secondary windings.

The current sensor 308a continuously measures amplitude of the excitation current supplied from the external power source 120 to the primary winding of the transformer 304 and amplitude of the excitation current supplied from the rechargeable battery BAU to the primary winding at predetermined time intervals, and inputs these measured values to the system control unit 52. The above predetermined time interval is an interval which is short enough to accurately measure the time variation of the above excitation current.

The system control unit 52 calculates (monitors) the time variation of the consumed power of the MRI apparatus 20A on the basis of the respective measured values (amplitude of the excitation current) on a real-time basis.

The system control unit 52 controls discharge and charge of the rechargeable battery BAU by controlling the charge/discharge control circuit 309 on the basis of the time variation of the consumed power of the MRI apparatus 20A and the charging voltage of the rechargeable battery BAU. For example, when the external electric power solely suffices for the consumed power of the MRI apparatus 20A, the system control unit 52 switches the state of electric power distribution for the above imaging system to the first state in which only the external electric power is supplied.

On the other hand, when the consumed power of the MRI apparatus 20A is so large as to run short of the electric power beyond the external electric power, the system control unit 52 switches the state to the second state in which both the external electric power and the accumulated electric power of the rechargeable battery BAU are supplied to the above imaging system. Concretely speaking, the system control unit 52 makes the rechargeable battery BAU discharge so as to provide the discharging current as a part of the excitation current.

Note that, the amount of the consumed power during implementation term of an imaging sequence differs by type of sequence. As cases where the MRI apparatus 20A runs short of the electric power beyond the external electric power, for example, the following three cases are possible. They are acquisition operations of the MR signals in each imaging sequence of EPI (Echo Planar Imaging), three-dimensional FFE (fast field echo), and SSFP (steady-state free precession) targeting a cardinal region as an imaging part.

During implementation term of an imaging sequence which requires a large amount of the consumed power as just described, it is preferable to cover the consumed power with the accumulated electric power of the rechargeable battery BAU and the external electric power. On the other hand, during implementation term of an imaging sequence which requires a standard amount of the consumed power, it is preferable to cover the consumed power with the external electric power only. This is because the maximum electric power supplied from the external power source (the maximum value of the external electric power) can be reduced by the above manner and accordingly a power-supply facility can be downsized.

In addition, the system control unit 52 controls discharge and charge of the rechargeable battery BAU, by controlling the charge/discharge control circuit 309 on the basis of the time variation of the consumed power of the MRI apparatus 20A and the charging voltage of the rechargeable battery BAU. For example, while the MRI apparatus 20A is being unoccupied such as night time, or while the MRI apparatus 20A is operating by consuming a small amount of electric power, the charge/discharge control circuit 309 supplies the external electric power from the external power source 120 to the rechargeable battery BAU as a charging current in accordance with control of the system control unit 52.

In addition, the system control unit 52 controls the charge/discharge control circuit 309 so that discharge or charge of the rechargeable battery BAU is not performed, when the charging voltage of the rechargeable battery BAU is the voltage at completion of charging and discharge of the rechargeable battery BA is unnecessary. The above when the rechargeable battery BA is unnecessary means, for example, a case where the consumed power of the MRI apparatus 20A is equal to or lower than the maximum value of the external electric power.

The system control unit 52 notifies that charging is being performed and starts charging of the rechargeable battery BAU, when the charging voltage of the rechargeable battery BAU is lower than a predetermined value before performance of an imaging sequence or after performance of an imaging sequence. The above notify means, for example, an operation in which the system control unit 52 makes the display device 64 display a warning such as waiting until completion of charging.

Note that, because the consumed power of the MRI apparatus 20A is smaller than the maximum amount of the external electric power except implementation term of an imaging sequence, there is no problem in supplying a part of the external electric power as the charging current of the rechargeable battery BAU.

Next, the method of judging whether an imaging sequence is practicable or not by the system control unit 52 will be explained. Before performing this judgment, the system control unit 52 calculates the estimated time variation of the consumed power in the case of performing the imaging sequence of the main scan in accordance with the set conditions.

The system control unit 52 preliminarily stores, for example, various patterns of conditions of an imaging sequence per type of pulse sequences such as EPI and the estimated time variation of the consumed power in each pattern. The estimated time variation of the consumed power in each pattern can be obtained by preliminarily calculating or measuring under simulation.

The above each pattern is an estimated time variation of the consumed power for representative values (representative conditions) of the respective parameters of conditions of the imaging sequence. The system control unit 52 preliminarily stores the respective estimated time variations for various representative values, and selects one whose conditions are the closest to the currently set imaging sequence, out of these estimated time variations.

The system control unit 52 modifies the consumed power of the selected pattern, on the basis of the difference in conditions between the imaging sequence of the selected pattern and the set imaging sequence. By this modification, the system control unit 52 calculates an estimated time variation of consumed power in the case of performing the imaging sequence of the main scan in accordance with the set conditions.

Note that, the above calculation method is only an example and other methods may be alternatively used. For example, an estimated time variation of the consumed power may be calculated by using an equivalent circuit model of the gradient magnetic field power supply 44 and the gradient magnetic field coil 26 and substituting the conditions of the imaging sequence into the equivalent circuit model. This is because the gradient magnetic field power supply 44 and the gradient magnetic field coil have the maximum consumed power and the maximum variation of the consumed power in the MRI apparatus 20A in time of acquiring the MR signals such as a main scan, in general.

As an example here, practicability of an imaging sequence is judged by determining whether the following two conditions are satisfied or not, on the basis of the accumulated electric power (remaining battery level) of the rechargeable battery BAU and the time variation of the estimated consumed power.

The first condition is that there is not any timing at which the (momentary) maximum value in the estimated time variation of the consumed power exceeds the maximum value of the available output power. The available output power means the sum of the maximum value of the external electric power supplied from the external power source 120 in FIG. 2 and the electric power of the discharging current from the rechargeable battery BAU.

The second condition is that the total consumed power through implementation term of an imaging sequence does not exceed the sum of the external electric power amount supplied through the implementation term and the accumulated electric power (remaining battery level) of the rechargeable battery BAU. Specifically, for example, the system control unit 52 judges whether a time integral value of the consumed power through the implementation term of an imaging sequence exceeds the sum of the external electric power amount supplied through the implementation term and the accumulated electric power of the rechargeable battery BAU or not.

If the above two conditions are satisfied, the system control unit 52 judges the imaging sequence to be practicable. If this is not the case, the system control unit 52 judges the imaging sequence to be impracticable. When the system control unit 52 judges the imaging sequence to be impracticable, the system control unit 52 calculates correction options of the conditions of the imaging sequence or restricts the conditions of the imaging sequence. After this, the system control unit 52 makes the display device 64 display a screen for setting conditions of the imaging sequence again with a warning.

As to the calculation of the correction options of conditions of the imaging sequence, the system control unit 52 calculates the correction options so as to reduce the consumed power to a degree of satisfying the above two conditions. In order to reduce the consumed power amount, i.e. reduce electric load, for example, lengthening a repetition time, decreasing a slice number, expanding FOV (Field Of View), decreasing step numbers of the phase encode and the frequency encode and so on are included.

Thereby, for example, a repetition time which is set longer than the current setting value so as to satisfy the above two conditions, step numbers of the phase encode and the frequency encode decreased to a degree of satisfying the above two conditions or the like are calculated as the correction options of the conditions.

Figure 3:
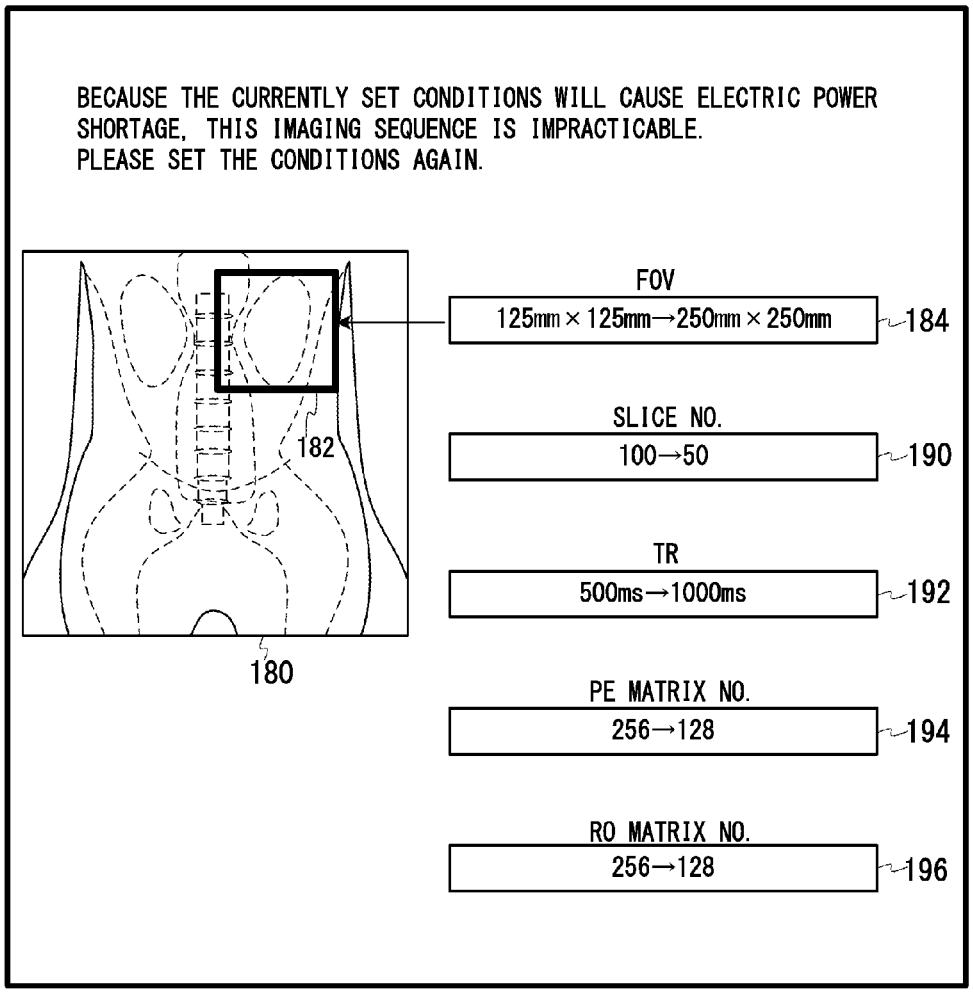
FIG. 3 is a schematic diagram showing an example of an input screen for setting conditions of an imaging sequence again, when the imaging sequence is judged to be impracticable.

FIG. 3 is a schematic diagram showing an example of an input screen for setting the conditions of the imaging sequence again, when the imaging sequence is judged to be impracticable. As shown in FIG. 3, as an example here, a warning display indicating that the imaging sequence is impracticable is textually added on the top of the screen.

In addition, a frame 182 of FOV is displayed inside a scout image 180, and boxes 184, 190, 192, 194 and 196 for setting the imaging conditions are displayed on the right side of the scout image 180.

In the example of FIG. 3, it is displayed in the box 184 as one correction option of the conditions of the imaging sequence to expand FOV from 125 mm×125 mm to 250 mm ×250 mm.

In addition, it is displayed in the box 190 as one correction option of the conditions of the imaging sequence to decrease the slice number from 100 to 50.

In addition, it is displayed in the box 192 as one correction option of the conditions of the imaging sequence to lengthen the repetition time TR from 500 ms to 1000 ms.

In addition, it is displayed in the box 194 and 196 as one correction option of the conditions of the imaging sequence to decrease the phase encode step number (PE MATRIX NO.) and the frequency encode step number (RO MATRIX NO.) from 256 to 128 respectively.

A user can reconfigure the conditions of the imaging sequence by selecting one or a plurality of the correction options of the conditions of the imaging sequence displayed on the display device 64 via the input device 62 so as to make the imaging sequence practicable.

As an example here, when the system control unit 52 judges the imaging sequence to be impracticable, the system control unit 52 restricts the settable range of the conditions of the imaging sequence so as not to increase consumed power. Concretely speaking, for example, the system control unit 52 restricts each condition (parameter) of the imaging sequence, in such a manner that a value or condition giving a larger consumed power than the consumed power given by the currently set value or the like cannot be inputted.

For example, if an operator inputs a shorter value than the currently set 500 ms as to the repetition time TR, the system control unit 52 may make the display device 64 perform an error display. As just described, the display device 64 displays an input screen whose settable range is restricted by the system control unit 52 in the above manner, as an input screen for setting the conditions of the imaging sequence again.

Figure 4:
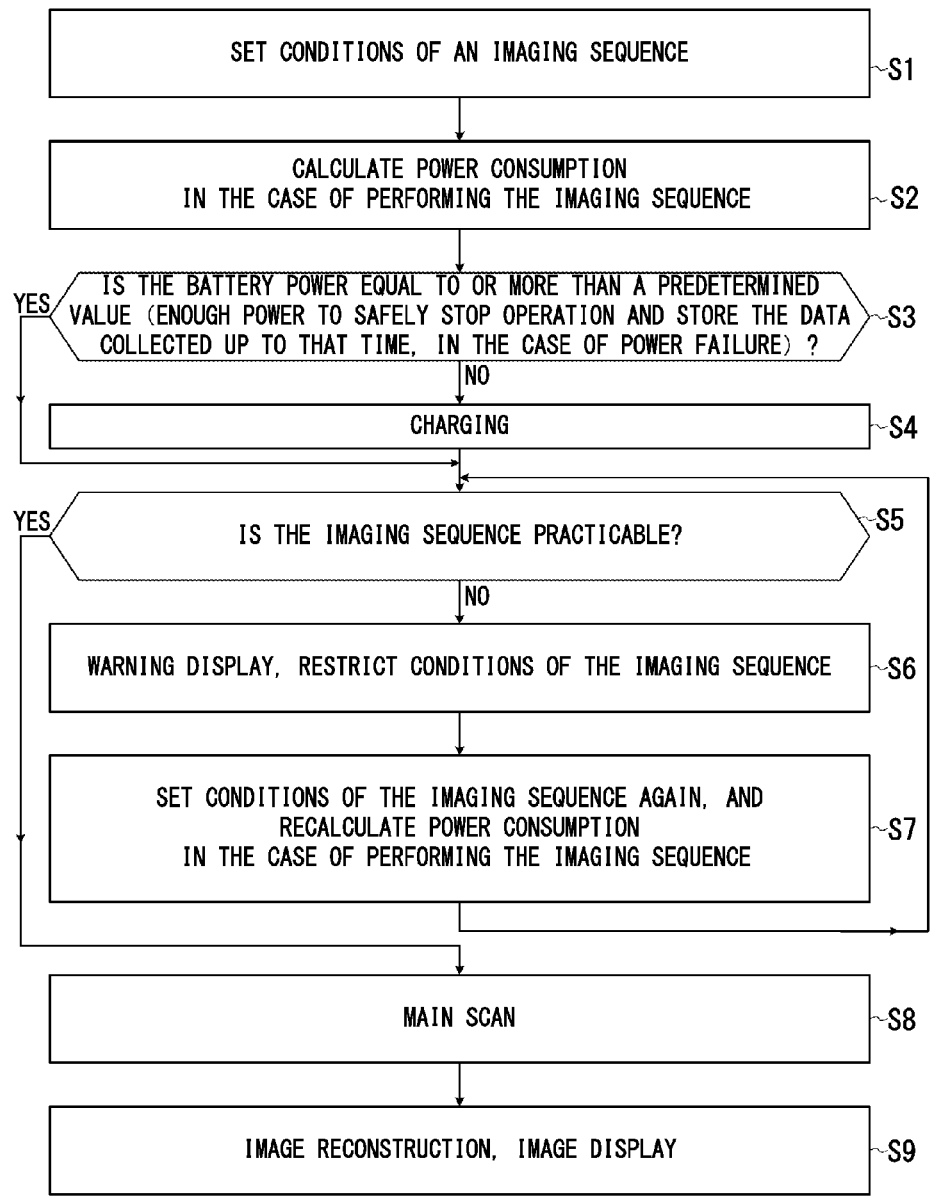
FIG. 4 is a flowchart illustrating a flow of an operation by the MRI apparatus of the first embodiment.

FIG. 4 is a flowchart illustrating a flow of an imaging operation by the MRI apparatus 20A of the first embodiment. While the MRI apparatus 20A is in operation, the system control unit 52 switches the rechargeable battery BAU from one of the charging condition, the discharging condition and the standby condition to another of them, by controlling discharge and charge of the rechargeable battery BAU as stated above. "While the MRI apparatus 20A is in operation" means, for example, a period during which the MRI apparatus 20A is powered on and it includes an implementation term of the processing of Step S1 to Step S9 in FIG. 4 as a part.

As an example here, it is assumed that possible cases of switching the rechargeable battery BAU to the discharging condition are a case of performing a prescan under a method involving a large consumed power in Step S1 and an implementation term of the main scan in Step S8. Thus, excluding Step S1 and Step S8, the rechargeable battery BAU is in the charging condition or in the standby condition. Note that, as an example of a prescan whose consumed power is large, a template shot for obtaining phase correction data in EPI (see Japanese Patent Application Laid-open (KOKAI) Publication No. 9-2762439) is included.

In the following, in accordance with the step numbers in the flowchart shown in FIG. 4, an imaging operation of the MRI apparatus 20A will be described by referring to the aforementioned FIG. 1 to FIG. 3 as required.

[Step S1] The system control unit 52 (see FIG. 1) sets some of conditions of the imaging sequence of the main scan on the basis of conditions of the imaging sequence inputted to the MRI apparatus 20A via the input device 62. In addition, other conditions of the imaging sequence such as a center frequency of an RF pulse are set by performing heretofore known prescans. By this manner, the system control unit 52 provisionally sets all the conditions of the imaging sequence of the main scan. After this, the process proceeds to Step S2.

[Step S2] The system control unit 52 calculates the estimated time variation of the consumed power in the case of performing the imaging sequence of the main scan under the conditions set in Step S1, in the aforementioned manner. After this, the process proceeds to Step S3.

[Step S3] The system control unit 52 judges whether or not the updated charging voltage of the rechargeable battery BAU inputted from the battery power detector BD (see FIG. 2) is from a predetermined value up. The above predetermined value is, for example, a charging voltage indicative of the accumulated electric power which is sufficient to perform saving of data of the MR signals collected up to that time and a process of safely bringing down the MRI apparatus 20A in the case of stopping supply of the external electric power due to electricity outage or the like. However, this is only an example. A larger value may be used as the predetermined value, or a voltage at completion of charging may be used as the predetermined value.

If the charging voltage of the rechargeable battery BAU is equal to or larger than the predetermined value, the process proceeds to Step S5. If this is not the case, the process proceeds to Step S4.

[Step S4] The system control unit 52 provides a charging current to the rechargeable battery BAU from the external power source 120, until the charging voltage of the rechargeable battery BAU reaches the predetermined value. At the same time, the system control unit 52 makes the display device 64 display notification such as waiting due to charging during the charging period, for example. After this, the process proceeds to Step S5.

[Step S5] The system control unit 52 calculates the accumulated electric power (remaining battery level) of the rechargeable battery BAU, on the basis of the updated charging voltage inputted from the battery power detector BD. The system control unit 52 judges whether the aforementioned two conditions are satisfied or not, on the basis of the accumulated electric power of the rechargeable battery BAU and the estimated time variation of the consumed power calculated in Step S2.

The first condition is that there is not any timing at which the (momentary) maximum value in the estimated time variation of the consumed power exceeds the maximum value of the available output power. The second condition is that the total consumed power through the implementation term of the imaging sequence does not exceed the sum of the external electric power amount supplied through the implementation term and the accumulated electric power of the rechargeable battery BAU.

If the above two conditions are satisfied, the system control unit 52 decides on using all the provisionally set conditions of the imaging sequence as determined conditions, and then proceeds to Step S8.

If at least one of the above two conditions are not satisfied, the system control unit 52 proceeds to Step 6. However, if the above judgment has been performed on the basis of a voltage lower than the voltage of the rechargeable battery BAU at completion of charging, the system control unit 52 may perform rejudgement in the following manner.

That is, the system control unit 52 assumes that the charging voltage of the rechargeable battery BAU is the voltage at completion of charging, and rejudges whether the above two conditions are satisfied or not. If the above two conditions are satisfied in the rejudgement, the system control unit 52 completes charging of the rechargeable battery BAU and then proceeds to Step S8. If at least one of the above two conditions are not satisfied in the rejudgement, the system control unit 52 proceeds to Step S6.

[Step S6] The system control unit 52 calculates the correction options of the conditions of the imaging sequence so as to satisfy the above two conditions, for example. In addition, the system control unit 52 makes the display device 64 display a screen for setting the respective conditions of the imaging sequence again with the aforementioned warning (see FIG. 3).

Note that, the conditions of the imaging sequence may be restricted by other methods, instead of displaying the correction options of the conditions of the imaging sequence. For example, input for the respective conditions of the imaging sequence may be restricted so as not to increase the consumed power more than the current setting values. For example, in the case of a repetition time, input is restricted in such a manner that a value shorter than the current setting value cannot be inputted. For example, in the case of FOV, input is restricted in such a manner that a range narrower than the current range cannot be set. After this, the process proceeds to Step S7.

[Step S7] At least one or some of the conditions of the imaging sequence is (are) set again by an operator. The system control unit 52 provisionally set all the conditions of the imaging sequence again on the basis of the reconfigured conditions or the like. After this, the estimated time variation of the consumed power in the case of performing the imaging sequence whose conditions are set again is calculated in the way similar to Step S2. After this, the process returns to Step S5.

That is, (1) the provisional setting of the conditions of the imaging sequence, (2) the calculation of the estimated time variation of consumed power in the case of performing the provisionally set imaging sequence and (3) the judgment processing as to whether the above two conditions are satisfied or not are repeated in order, until the above two conditions are satisfied.

[Step S8] If the process reaches to this Step S8, the currently set imaging sequence satisfies the above two conditions and is judged to be practicable in terms of electric power. Thus, the system control unit 52 decides on using all the currently set conditions of the imaging sequence as determined conditions, and makes each component of the MRI apparatus 20A perform the main scan on the basis of the determined conditions of the imaging sequence.

More specifically, the object P is loaded on the table 32a and a static magnetic field is formed in the imaging space by the static magnetic field magnet 22 excited by the static magnetic field power supply 40. In addition, the electric current is supplied from the shim coil power supply 42 to the shim coil 24, and thereby the static magnetic field formed in the imaging space is uniformed.

Then, when the system control unit 52 receives a command of start of imaging from the input device 62, the system control unit 52 drives the gradient magnetic field power supply 44, the RF transmitter 46 and the RF receiver 48 in accordance with the determinate conditions of the imaging sequence, thereby a gradient magnetic field is formed in the imaging region where the imaging part of the object P is located and RF pulses are generated from the transmission RF coil 28.

Thus, MR signals generated by nuclear magnetic resonance inside the object P are detected by the reception RF coil 29 and the RF coil device 100, and received by the RF receiver 48. The RF receiver 48 performs predetermined signal processing on the detected MR signals and then performs A/D conversion on the MR signals so as to generate raw data of the MR signals. The RF receiver 48 inputs the generated raw data of the MR signals to the image reconstruction unit 56. The image reconstruction unit 56 generates the k-space data on the basis of the raw data of the MR signals, and stores them.

While the above main scan is being performed, the system control unit 52 switches the rechargeable battery BAU from one of the charging condition, the discharging condition and the standby condition to another of them, in the following manner. Concretely speaking, the system control unit 52 calculates the time variation of the consumed power of the MRI apparatus 20A on the basis of the measured values of the current sensor 308a on a real-time basis in the above manner. The system control unit 52 switches the state of the rechargeable battery BAU on a real-time basis in accordance with the calculated consumed power, like the following first case, second case and third case.

As the first case, in a period during which the external electric power cannot cover the consumed power of the MRI apparatus 20A, the charge/discharge control circuit 309 switches the rechargeable battery BAU to the discharging condition in accordance with command of the system control unit 52.

As the second case, if the consumed power of the MRI apparatus 20A is smaller than the maximum value of the external electric power and the charging voltage of the rechargeable battery BAU is below the voltage at completion of charging, the charge/discharge control circuit 309 charges the rechargeable battery BAU with the external electric power in accordance with command of the system control unit 52 (the charging condition).

If the state does not correspond to the above first case or the second case (i.e. the state corresponds to the third case), the charge/discharge control circuit 309 controls so that discharge or charge of rechargeable battery BAU is not performed in accordance with command of the system control unit 52 (the standby condition). After this, the process proceeds to Step S9.

[Step S9] The image reconstruction unit 56 reconstructs image data by performing the image reconstruction processing including Fourier transformation on the k-space data, and stores the reconstructed image data in the image database 58.

The image processing unit 60 obtains the image data from the image database 58, generates display image data for two-dimensional display by performing predetermined image processing on the obtained image data, and stores these display image data in the storage device 66. The system control unit 52 inputs the display image data from the storage device 66 to the display device 64, and makes the display device 64 display images indicated by the display image data.

The foregoing is a description of an operation of the MRI apparatus 20A of the first embodiment.

As just described, the MRI apparatus 20 of the first embodiment is a hybrid-type which operates on the basis of the external electric power supplied from outside and the accumulated electric power of the rechargeable battery BAU charged with the external electric power. Thus, it can operate by using the accumulated electric power of the rechargeable battery BAU and the external electric power in the case of performing an imaging sequence which requires a lot of electric power, and it can operate by using only the external electric power in other cases.

In the above configuration, the maximum value of the external electric power supplied from the external power source 120 can be decreased by the amount of the accumulated electric power of the rechargeable battery BAU, without reducing the maximum consumed power. Thus, a power-supply facility can be downsized without restricting conditions of the imaging sequence further than conventional technology (without reducing the maximum consumed power).

In addition, the MRI apparatus 20A of the first embodiment judges practicability of an imaging sequence before its performance, and sets the conditions the imaging sequence again with a warning display in the case of judging it to be impracticable. Thus, a situation in which an imaging sequence is discontinued in the middle of its performance because of shortage of the remaining battery level never happens.

Moreover, the MRI apparatus 20A of the first embodiment calculates and displays the correction options of the conditions of the imaging sequence, in the case of judging the imaging sequence to be impracticable. Thus, an operator can easily set conditions of an unfailingly practicable imaging sequence.

According to the aforementioned embodiment, a power-supply facility can be downsized without reducing the maximum consumed power in MRI. The technological thought of the first embodiment in which the MRI apparatus is configured as a hybrid-type and the charge/discharge element for power supply is charged during imaging if possible in the above manner never exists in conventional technology.

Note that, in the above example, an example in which the consumed power of the entirety of the MRI apparatus 20A is calculated, the rechargeable battery BAU is discharged in the case of the entire consumed power higher than a predetermined value, and the external electric power solely covers the consumed power in the case of the entire consumed power equal to or lower than the predetermined value has been explained. However, embodiments of the present invention are not limited to such an aspect. For example, a power-supply facility may be downsized by covering power up to a predetermined value with the external electric power per each unit of the MRI apparatus and appropriately supplementing excess power with the accumulated electric power of the charge/discharge element.

Figure 5:
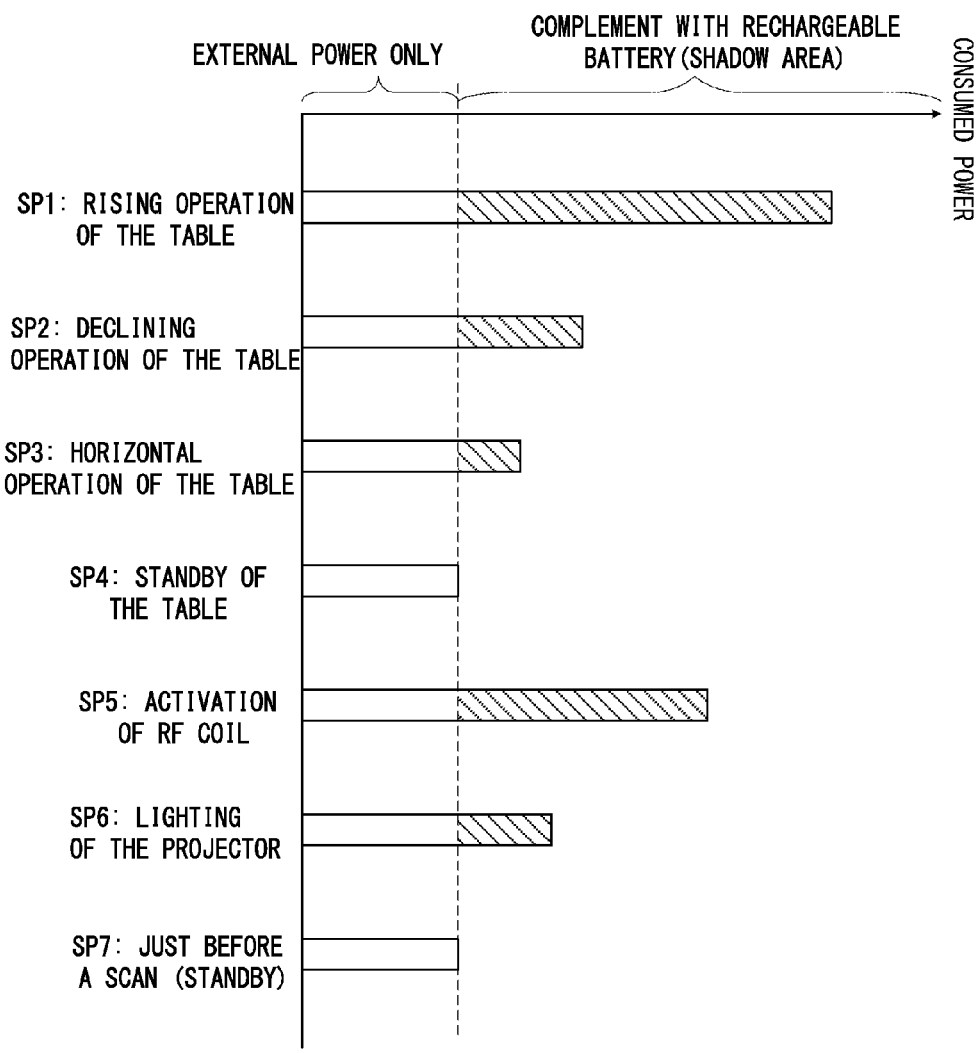
FIG. 5 is a schematic diagram showing a concept of an embodiment of a hybrid-type MRI apparatus per operation content.

FIG. 5 is a schematic diagram showing a concept of an embodiment of the hybrid-type MRI apparatus 20A per operation content. In FIG. 5, the horizontal axis indicates amplitude of the consumed power of the MRI apparatus 20A during implementation term of each of SP1 to SP7 operations given as examples. As described below, a configuration in which consumed power is solely covered with the external electric power in the standby state of each unit so as to preserve the accumulated electric power of the rechargeable battery BAU for implementation term of the main scan is preferable.

SP1 to SP4 in FIG. 5 are examples of supply power to the table driving device 32b in FIG. 2. Concretely speaking, the consumed power of the table driving device 32b in the standby state SP4 (a state in which the table 32a can be moved any time) is the predetermined electric power shown by the dashed line in FIG. 5. Up to this predetermined electric power, the consumed power of the table driving device 32b is covered with the external electric power.

On the other hand, in each implementation term of the rising operation SP1 of the table 32a, the declining operation SP2 of the table 32a and the horizontal moving operation SP3 of the table 32a, the consumed power of the table driving device 32b exceeds the above predetermined electric power by the amount shown with shadow area in FIG. 5. During each implementation term of these operations, the external electric power covers the consumed power of the table driving device 32b up to the predetermined electric power and discharge power covers the amount exceeding the predetermined electric power.

In FIG. 5, the activation operation SP5 of RF coils is, for example, a switching operation between a transmission mode of RF pulses and a reception mode of MR signals, and the activation operation SP5 of RF coils includes the following three cases, for example.

Firstly, if a whole body coil is included in the transmission RF coil 28, it is a switching operation between a mode of transmitting RF pulses by the whole body coil and a mode of receiving MR signals by the whole body coil.

Secondly, if an RF coil device capable of transmission and detection is set on the object P, it is a switching operation between a mode of transmitting RF pulses by this RF coil device and a mode of receiving MR signals by this RF coil device.

Thirdly, it is a switching operation of switching a receiving RF coil device set on the object P to an off-state mode incapable of detecting MR signals or a mode capable of detecting MR signals. More specifically, in a period during which an RF pulse is transmitted from the transmission RF coil 28, the receiving RF coil device is switched to the off-state mode in order to prevent a circuit destruction of the receiving RF coil device due to the RF pulse. In a period during which an RF pulse is transmitted, the receiving RF coil device is switched to the mode capable of detecting MR signals.

In the consumed power during implementation term of the activation operation SP5 of RF coils, a portion in excess of the predetermined electric power is covered with the discharge electric power of the rechargeable battery BAU and the rest (up to the predetermined electric power) is covered with the external electric power. The same applies to the lighting operation SP6 of the projector 35.

The just before a scan SP7 is, for example, the consumed power of the gradient magnetic field power supply in the standby state under which a scan can be immediately started by pushing a start button of the input device 62, and the electric power in this standby state is solely covered with the external electric power. Similarly, at least the electric power in this standby state is solely covered with the external electric power in each of other units in the imaging system such as the RF transmitter 46 in FIG. 1.

As just described, a power-supply facility can also be downsized by covering the electric power up to the predetermined value with the external electric power and appropriately supplementing the surplus in excess of the predetermined value by the accumulated electric power of the rechargeable battery BAU, per unit of the MRI apparatus 20A.

However, the above electric power control is only an example. The system control unit 52 may control the power supply system, for example, in such a manner that the electric power consumed by units except the data acquisition system such as the table driving device 32b and the projector 35 in the standby state is provided from the rechargeable battery BAU.

The foregoing is the explanation of the first embodiment. In the following, the second embodiment to the fifth embodiment will be explained. In terms of configuration, the MRI apparatus 20B to 20E of the second embodiment to the fifth embodiment differ in (1) the monitoring method of the consumed power of the MRI apparatus, (2) the supply destination of the external electric power and (3) the supply destination of accumulated electric power of the rechargeable battery. Because the configuration of mainly the imaging system of each of the MRI apparatus 20B to 20E of the second embodiment to the fifth embodiment is the same as that in the first embodiment explained with FIG. 1, its explanation is omitted.

<The Second Embodiment>

Figure 6:
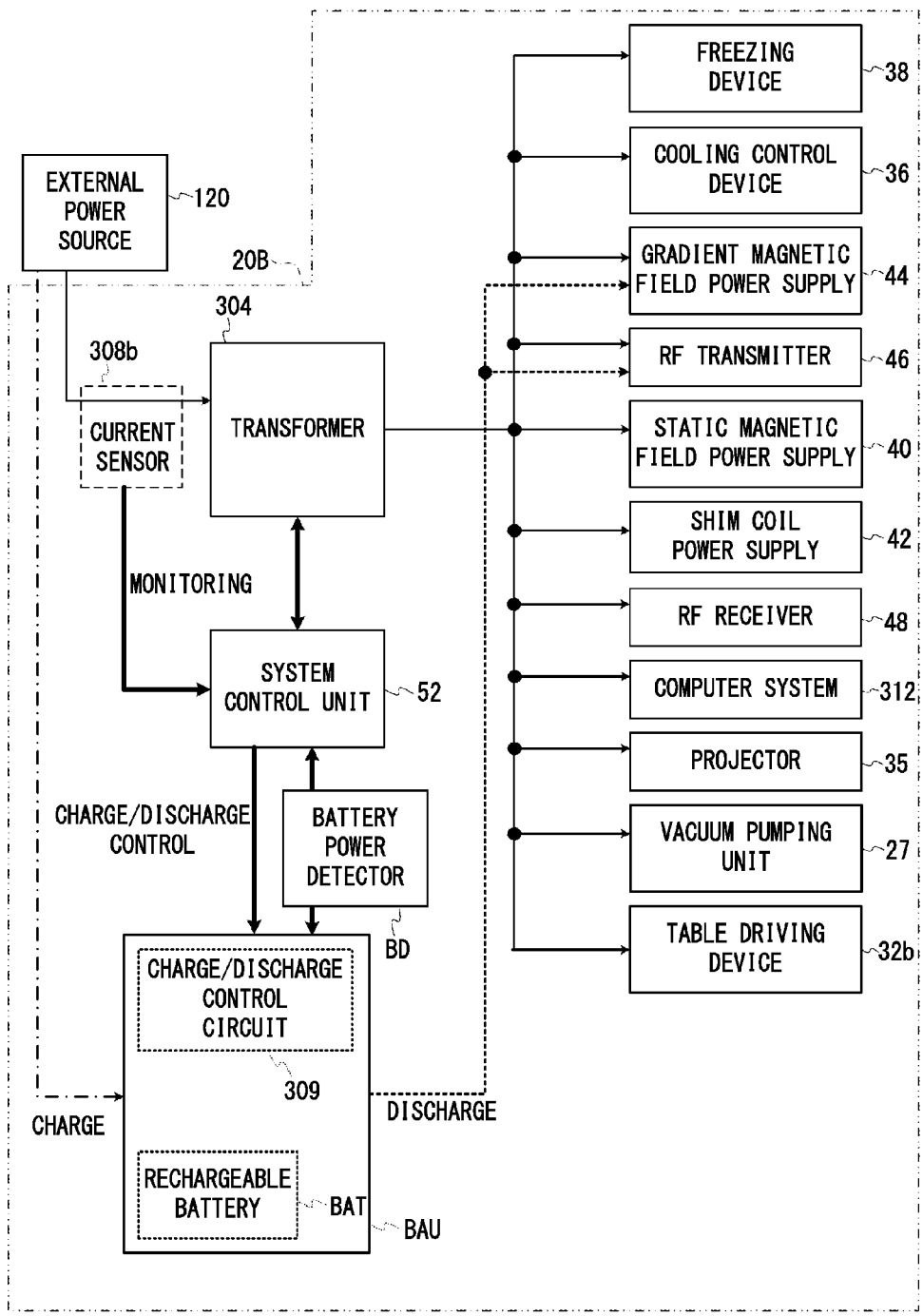
FIG. 6 is a block diagram showing the structure of the power supply system of the MRI apparatus of the second embodiment.

FIG. 6 is a block diagram showing the structure of the power supply system of the MRI apparatus 20B of the second embodiment. In the following, the MRI apparatus 20B of the second embodiment will be explained, focusing on the difference between the first embodiment and the second embodiment.

As shown in FIG. 6, the MRI apparatus 20B includes a current sensor 308b instead of the current sensor 308a in the first embodiment. The current sensor 308b measures a value of the excitation current supplied from the external power source 120 to the primary winding of the transformer 304, without detecting the discharge current from the rechargeable battery BAU, and inputs the measured value to the system control unit 52. That is, the second embodiment is the same as the first embodiment in that the system control unit 52 calculates the time variation of the consumed power of the MRI apparatus 20B by monitoring the amount of the excitation current of the primary side on a real-time basis.

Although the accumulated electric power of the rechargeable battery BAU is supplied as the excitation current of the primary side in the first embodiment, the accumulated electric power of the rechargeable battery BAU is directly supplied to only the gradient magnetic field power supply 44 and the RF transmitter 46 on the secondary side of the transformer in the second embodiment. This point is the difference between the first embodiment and second embodiment, and other structures are the same as the first embodiment.

In the MRI apparatus 20B of the second embodiment configured as presented above, the system control unit 52 switches the rechargeable battery BAU from one of the charging condition, the discharging condition and the standby condition to another of them, by controlling the charge/discharge control circuit 309 in the way similar to the first embodiment. In addition, the system control unit 52 controls performance of the imaging sequence in the way similar to the operation explained with FIG. 4. Thus, in the second embodiment, the same effects as the first embodiment can be obtained.

<The Third Embodiment>

Figure 7:
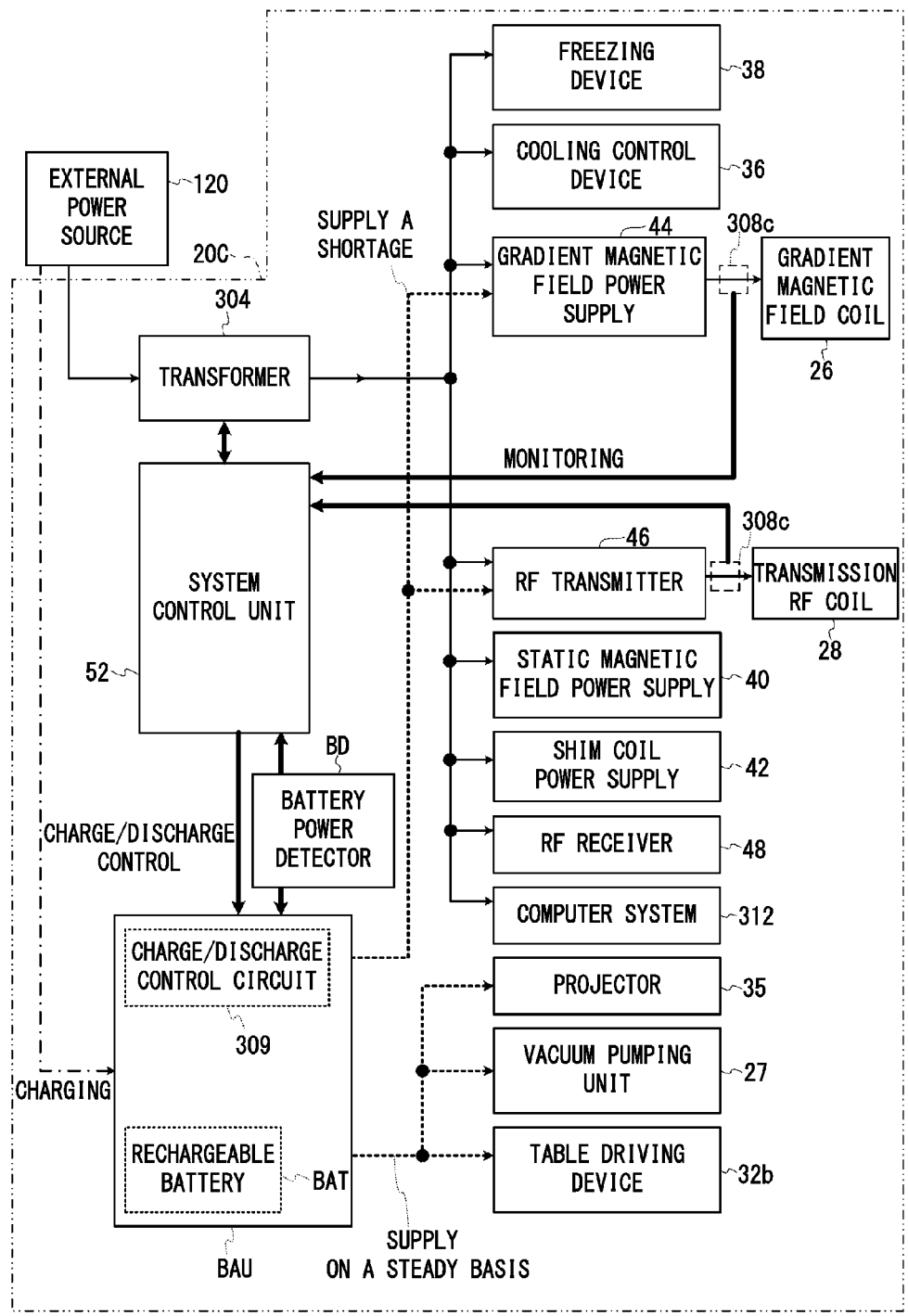
FIG. 7 is a block diagram showing the structure of the power supply system of the MRI apparatus of the third embodiment.

FIG. 7 is a block diagram showing the structure of the power supply system of the MRI apparatus 20C of the third embodiment. The MRI apparatus 20C of the third embodiment is different from the first embodiment in the following three points.

Firstly, the monitoring of the consumed power of the MRI apparatus 20C by the system control unit 52 is performed by measuring not the primary side but the output power of the gradient magnetic field power supply 44 and the output power of the RF transmitter 46. Concretely speaking, for example, two current sensors 308c are disposed. One of the current sensors 308c measures an output electric current value of the gradient magnetic field power supply 44, and inputs it to the system control unit 52. The other of the current sensors 308c measures an output electric current value of the RF transmitter 46, and inputs it to the system control unit 52.

During implementation term of an imaging sequence, the unit whose consumed power is the largest is the gradient magnetic field power supply 44 in general, and the unit whose consumed power is the second largest after the gradient magnetic field power supply 44 is the RF transmitter 46. In addition, during implementation term of an imaging sequence, the unit whose consumed power varies the most is the gradient magnetic field power supply 44 in general, and the unit whose consumed power varies the second most is the RF transmitter 46. Thus, the system control unit 52 roughly estimates the time variation of the consumed power of the MRI apparatus 20C on a real-time basis in accordance with the time variation of each output of the gradient magnetic field power supply 44 and the RF transmitter 46 and the conditions of the imaging sequence.

Secondly, the third embodiment is different from the first embodiment in that the external electric power is not supplied to the projector 35, the table driving device 32b and the vacuum pumping unit 27. Thus, the electric power of the secondary side of the transformer by the induced current is supplied to each component of the MRI apparatus 20C except the projector 35, the table driving device 32b and the vacuum pumping unit 27.

Thirdly, the supply destination of the accumulated electric power of the rechargeable battery BAU differs. The accumulated electric power of the rechargeable battery BAU is supplied to the gradient magnetic field power supply 44, the RF transmitter 46, the projector 35, the table driving device 32b and the vacuum pumping unit 27 only.

Thus, in the third embodiment, the gradient magnetic field power supply 44 and the RF transmitter 46 operate under a hybrid power system, the projector 35, the table driving device 32b, the vacuum pumping unit 27 operate by using only the accumulated electric power of the rechargeable battery BAU, and the other units such as the computer system 312 operate by using only the external electric power. Other hardware structures are the same as the first embodiment.

Although the operation of the MRI apparatus 20C during implementation term of an imaging sequence is similar to Step S1 to Step S9 in FIG. 4 in the first embodiment, the control of discharge and charge of the rechargeable battery BAU by the system control unit 52 differs. Concretely speaking, in the above MRI apparatus 20C, because the rechargeable battery BAU supplies electric power to the projector 35, the table driving device 32b and the vacuum pumping unit 27 on a steady basis during implementation term of an imaging sequence of the main scan, the rechargeable battery BAU does not become the standby condition.

Thus, the system control unit 52 switches the power supply situation of a part of the imaging system (the gradient magnetic field power supply 44 and the RF transmitter 46) into the first condition or the second condition, by switching the rechargeable battery BAU into the charging condition or the discharging condition. As an example in the third embodiment, the first condition is a condition in which it operates by using only the external electric power, and the second condition is a condition in which it operates by using the external electric power and the accumulated electric power of the rechargeable battery BAU. Thus, in the Step S3 of FIG. 4, if it is judges that the electric power necessary for performing the imaging sequence is lacking, the system control unit 52 increases the accumulated electric power of the rechargeable battery BAU by switching the rechargeable battery BAU into the charging condition in the Step S4 before performance of the main scan.

During implementation term of an imaging sequence, the system control unit 52 controls power supply quantity from the rechargeable battery BAU to the gradient magnetic field power supply 44 and the RF transmitter 46. That is, the system control unit 52 judges whether the gradient magnetic field power supply 44 is deficient in electric power beyond the supply from the external electric power or not, on the basis of the output of the gradient magnetic field power supply 44. If it is judged to be deficient, the system control unit 52 makes the rechargeable battery BAU provide electric power corresponding to shortfall to the gradient magnetic field power supply 44, by controlling the charge/discharge control circuit 309.

Similarly, the system control unit 52 judges whether the RF transmitter 46 is deficient in electric power beyond the supply from the external electric power or not, on the basis of the output of the RF transmitter 46. If it is judged to be deficient, the system control unit 52 makes the rechargeable battery BAU provide electric power corresponding to shortfall to the RF transmitter 46, by controlling the charge/discharge control circuit 309.

In the third embodiment configured as presented above, the same effects as the first embodiment can be obtained.

In the third embodiment, an example in which only the gradient magnetic field power supply 44 and the RF transmitter 46 operate under a hybrid power system has been explained. However, this is only an example. As a modified example of the third embodiment, for instance, the freezing device 38, the computer system (computer) 312, the gradient magnetic field power supply 44 and the RF transmitter 46 may operate under a hybrid power system, the RF coil device 100 may operate by using only the electric power of the rechargeable battery BAU, and other units may operate by using only the external electric power.

<The Fourth Embodiment>

Figure 8:
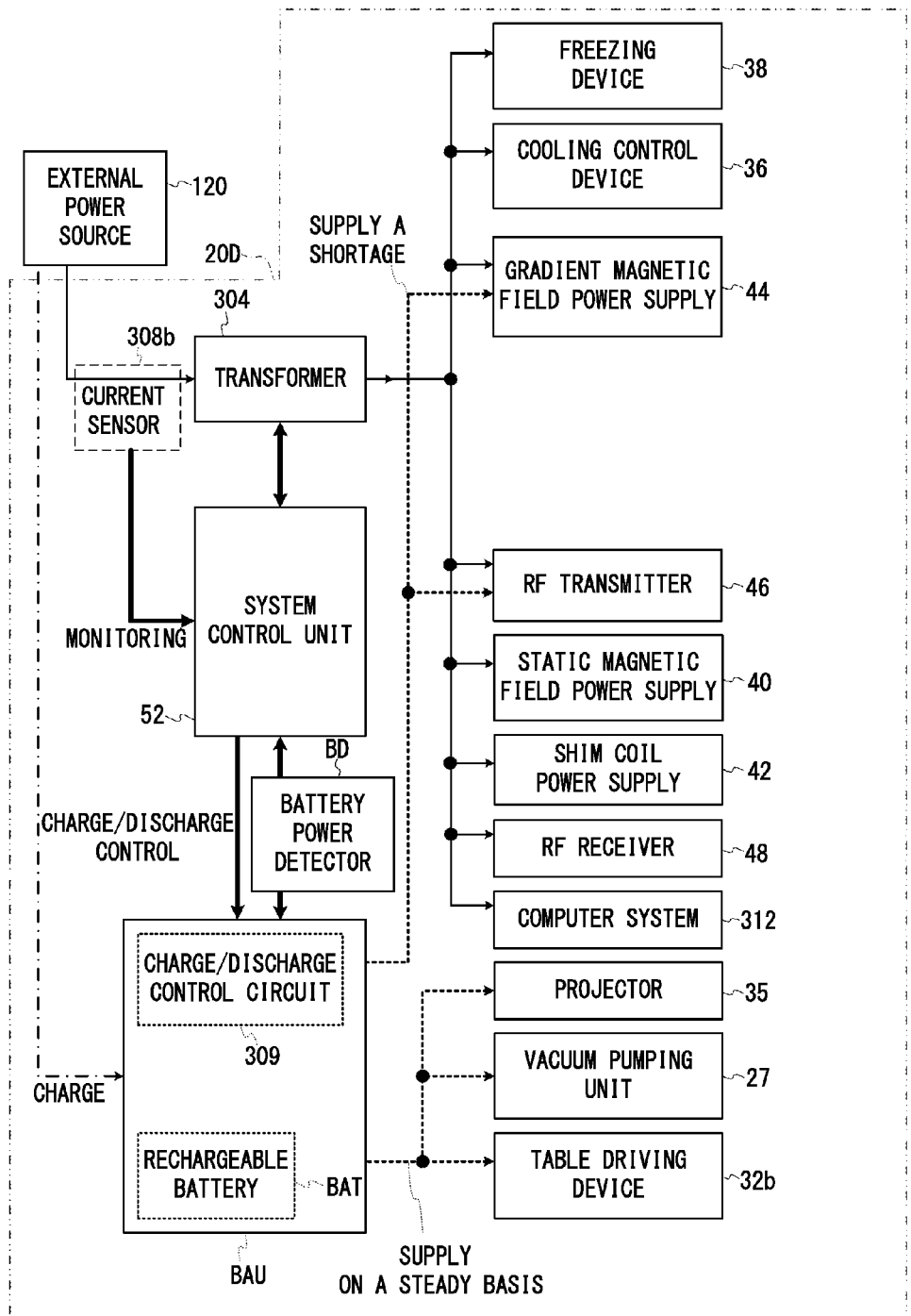
FIG. 8 is a block diagram showing the structure of the power supply system of the MRI apparatus of the fourth embodiment.

FIG. 8 is a block diagram showing the structure of the power supply system of the MRI apparatus 20D of the fourth embodiment. The MRI apparatus 20D of the fourth embodiment is the same as the third embodiment except the following point. That is, in the fourth embodiment, the system control unit 52 monitors the time variation of the consumed power of the MRI apparatus 20D, on the basis of not the output of the gradient magnetic field power supply 44 and the RF transmitter 46 but the amplitude of the excitation current in the primary side in the way similar to the second embodiment.

Other structures are the same as the third embodiment. Thus, in the fourth embodiment, the same effects as the third embodiment can be obtained.

Note that, as an modified example of the fourth embodiment, for instance, the freezing device 38, the computer system 312, the gradient magnetic field power supply 44 and the RF transmitter 46 may operate under a hybrid power system, the RF coil device 100 may operate by using only the electric power of the rechargeable battery BAU, and other units may operate by using only the external electric power.

<The Fifth Embodiment>

Figure 9:
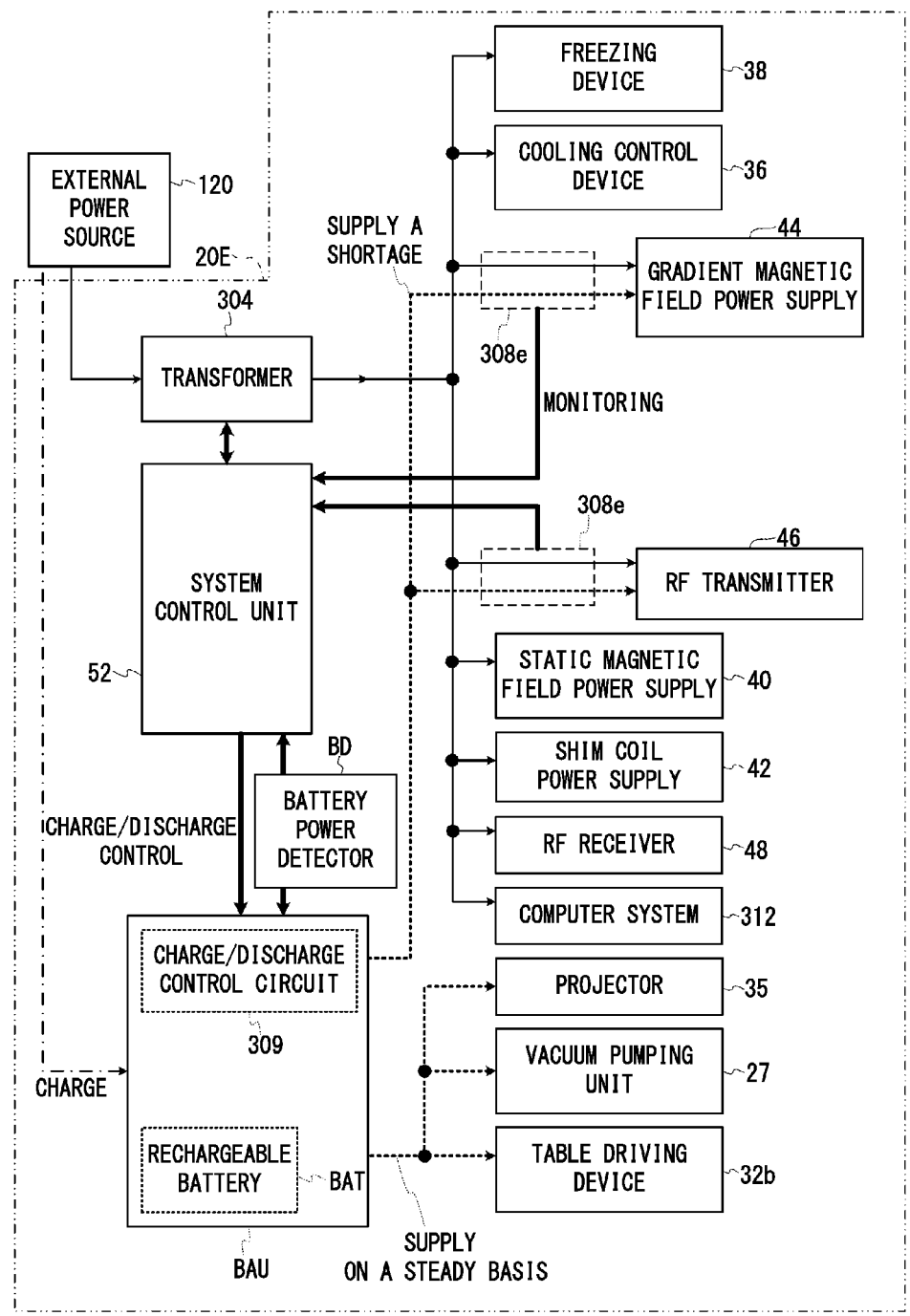
FIG. 9 is a block diagram showing the structure of the power supply system of the MRI apparatus of the fifth embodiment.

FIG. 9 is a block diagram showing the structure of the power supply system of the MRI apparatus 20E of the fifth embodiment. The MRI apparatus 20E of the fifth embodiment is the same as the third embodiment except the following point. That is, in the fifth embodiment, the system control unit 52 calculates the time variation of the consumed power of the MRI apparatus 20E, on the basis of the conditions of the imaging sequence and input power to the gradient magnetic field power supply 44 and the RF transmitter 46.

Concretely speaking, the MRI apparatus 20E includes two current sensors 308e, instead of the two current sensors 308c of the third embodiment.

One of the current sensors 308e measures an electric current value supplied from the transformer 304 to the gradient magnetic field power supply 44 and an electric current value supplied from the rechargeable battery BAU to the gradient magnetic field power supply 44 respectively, and input these measured values to the system control unit 52.

The other of the current sensors 308e an electric current value supplied from the transformer 304 to the RF transmitter 46 and an electric current value supplied from the rechargeable battery BAU to the RF transmitter 46 respectively, and input these measured values to the system control unit 52.

The system control unit 52 calculates the input power to the gradient magnetic field power supply 44 and the input power to the RF transmitter 46 respectively and thereby roughly estimates the time variation of the consumed power of the MRI apparatus 20E.

The other structures are the same as the third embodiment. Thus, in the fifth embodiment, the same effects as the third embodiment can be obtained.

Note that, as a modified example of the fifth embodiment, for instance, the freezing device 38, the computer system 312, the gradient magnetic field power supply 44 and the RF transmitter 46 may operate under a hybrid power system, the RF coil device 100 may operate by using only the electric power of the rechargeable battery BAU, and other units may operate by using only the external electric power.

<The Sixth Embodiment>

Figure 10:
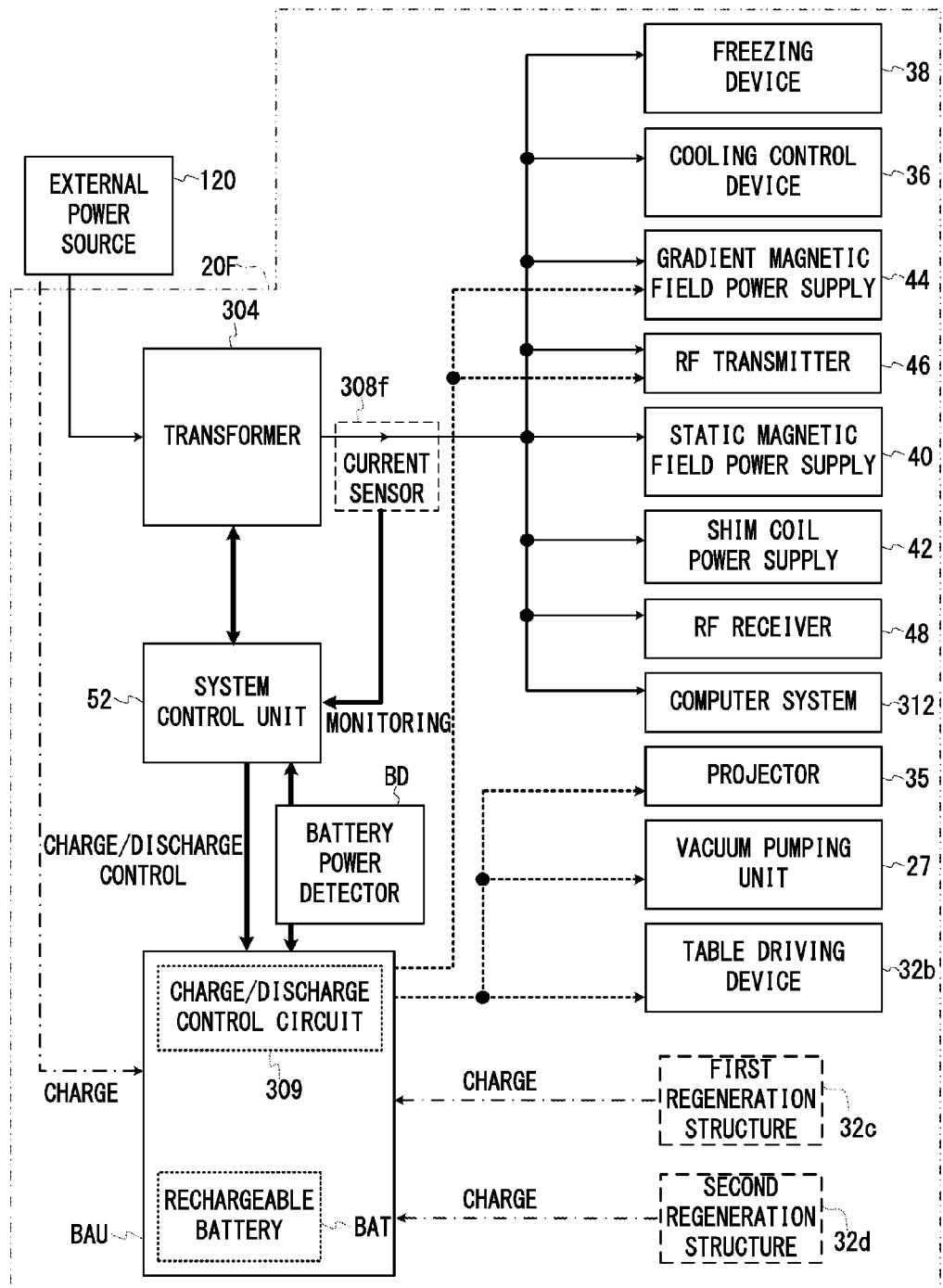
FIG. 10 is a block diagram showing the structure of the power supply system of the MRI apparatus of the sixth embodiment.

FIG. 10 is a block diagram showing the structure of the power supply system of the MRI apparatus 20F of the sixth embodiment. The MRI apparatus 20F of the sixth embodiment is the same as the MRI apparatus 20E of the fifth embodiment except that the first regeneration structure 32c and the second regeneration structure 32d are additionally disposed in the bed 32. Note that, the current sensor 308f detects the entire output power of the secondary side of the transformer 304, and inputs it to the system control unit 52.

Although the table driving device 32b move the table 32a in the horizontal direction and the vertical direction, the first regeneration structure 32c functions while the table 32a is moving in the horizontal direction, and the second regeneration structure 32d functions while the table 32a is moving downward.

Concretely speaking, the first regeneration structure 32c converts friction energy, generated when the table driving device 32b puts a brake on the table 32a moving in the horizontal direction, into electrical energy. The first regeneration structure 32c supplies the electrical energy converted as just described to the rechargeable battery BAU.

The charge/discharge control circuit 309 charges the rechargeable battery BAU by using the electric current supplied from the first regeneration structure 32c, in accordance with control of the system control unit 52.

On the other hand, the second regeneration structure 32d converts potential energy lost from the table 32a moving in the gravitational direction. The second regeneration structure 32d supplies the electrical energy converted as just described to the rechargeable battery BAU.

The charge/discharge control circuit 309 charges the rechargeable battery BAU by using the electric current supplied from the second regeneration structure 32d, in accordance with control of the system control unit 52.

As just described, in the sixth embodiment, the same effects as the fifth embodiment can be obtained and the consumed power of the MRI apparatus 20F can be reduced by the energy regeneration function (regeneration capability). That is, apart of the consumed power of the MRI apparatus 20F is converted into motional energy of the table 32a, then a part of this motional energy is converted into electrical energy again, and the rechargeable battery BAU can be charged by this electrical energy. Thus, the rechargeable battery BAU for the hybrid operation is charged with not only the external electric power but also the regeneration function, and accordingly, the consumed power of the MRI apparatus 20F can be decreased.

Note that, as an modified example of the sixth embodiment, for instance, the freezing device 38, the computer system 312, the gradient magnetic field power supply 44 and the RF transmitter 46 may operate under a hybrid power system, the RF coil device 100 may operate by using only the electric power of the rechargeable battery BAU, and other units may operate by using only the external electric power.

<Supplementary Notes on the First to Sixth Embodiments>

[1] In the first embodiment to the sixth embodiment, an example in which the external electric power supplied to the primary side is provided to the respective units on the secondary side via the transformer 304 has been explained. However, the MRI apparatuses 20A to 20F of the respective embodiments are not limited to an aspect of distributing electric power via the transformer 304. For example, the external electric power may be directly distributed to at least some of the units.

[2] If the external electric power stops supply during operating period (power-on period) of the MRI apparatuses 20A to 20F by, for example, power failure, the MRI apparatuses 20A to 20F preferably operate by using the accumulated electric power of the rechargeable battery BAU. In this case, the system control unit 52 preferably switches the operation state of the MRI apparatuses 20A to 20F, after judging whether the imaging sequence can be performed through to completion or not, on the basis of the charging voltage of the rechargeable battery BAU.

If the imaging sequence can be performed through to completion, the system control unit 52 may perform the imaging sequence through to completion by controlling the charge/discharge control circuit 309 so as to provide the accumulated electric power of the rechargeable battery BAU to each component of the MRI apparatus (20A to 20F). After this, the system control unit 52 may safely stop operation of the MRI apparatus (20A to 20F) under the state where the k-space data are stored.

If the imaging sequence cannot be performed through to completion, the system control unit 52 may control the charge/discharge control circuit 309 so as to supply the accumulated electric power of the rechargeable battery BAU to the computer system 312 or the like and store the k-space data of the MR signals already collected. At the same time, the system control unit 52 may safely discontinue the imaging sequence and may safely stop operation of the MRI apparatuses 20A to 20F.

[3] As the MRI apparatus 20, an example in which the RF receiver 48 is disposed outside the gantry 21 has been described (see FIG. 1). However, the RF receiver 48 may be included in the gantry 21.

Specifically, for example, an electronic circuit board that is equivalent to the RF receiver 48 may be disposed in the gantry 21. Then, the MR signals, which are analog electrical signals converted from the electromagnetic waves by the reception RF coil 29 and the wearable RF coil device 100, may be amplified by a preamplifier in the electronic circuit board, the amplified signals may be outputted to the outside of the gantry 21 as digital signals and inputted to the image reconstruction unit 56. In outputting the signals to the outside of the gantry 21, for example, an optical communication cable is preferably used to transmit the signals in the form of optical digital signals. This is because the effect of external noise is reduced.

An example in which only the external electric power is supplied to at least a part of the imaging system as the first condition of the hybrid operation of the MRI apparatus, and the external electric power and the accumulated electric power of the rechargeable battery BAU are supplied to at least a part of the imaging system as the second condition of the hybrid operation has been explained. However, embodiments of the present invention are not limited to such an aspect. For example, if the accumulated electric power (battery capacity) of the rechargeable battery BAU is extremely large, only the accumulated electric power of the rechargeable battery BAU may be supplied to at least a part of the imaging system as the first condition.

[5] As to the number of the rechargeable battery BAU (the battery unit BAU), it is not limited to one but a plurality of the rechargeable batteries may be disposed.

[6] In the following, correspondences between terms used in the claims and terms used in the embodiment will be described. Note that the correspondences described below are just some of possible interpretations for reference and should not be construed as limiting the present invention.

The functions of the charge/discharge control circuit 309 and the system control unit 52 that switch the operation state of a part or the entirety of the imaging system of the MRI apparatuses 20A to 20F into a condition of operating by using only the external electric power or a condition of operating by using the external electric power and the accumulated electric power of the rechargeable battery BAU by controlling discharge and charge of the rechargeable battery BAU in accordance with the consumed power of the MRI apparatuses 20A to 20F are examples of the power control unit described in the claims.

In the first embodiment, the transformer 304, the charge/discharge control circuit 309, the battery unit BAU, the current sensor 308*a*, the battery power detector BD and the function of the system control unit 52 that controls them in terms of electric power are examples of the electric power system described in the claims. Although there are slight differences in components such as the current sensor 308*b* or the like, the same applies to the second to the sixth embodiments.

[7] While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A magnetic resonance imaging (MRI) apparatus comprising:
   a data acquisition system configured to acquire a nuclear magnetic resonance (NMR) signal from an imaging region by performing an MRI sequence with application of a gradient magnetic field and transmission of an RF pulse to the imaging region;
   a hybrid electric power system configured to selectively provide electric power to different power consuming portions of the MRI apparatus, said hybrid electric power system including a charge/discharge element configured to be controllably charged with external electric power; and a power controller configured to control the electric power system in such a manner that (a) at least one power consuming portion excluding the data acquisition system is supplied with electric power from the charge/discharge element, and (b) at least one power consuming portion included in the data acquisition system is supplied with a controlled amount of electric power from the charge/discharge element, said controlled amount corresponding to an amount of power consumed in executing an MRI sequence.

2. The magnetic resonance imaging apparatus according to claim 1, wherein the power controller is configured to control the electric power system in such a manner that electric power consumed in a standby state of every power consuming portion except the data acquisition system is supplied from the charge/discharge element.

3. The magnetic resonance imaging apparatus according to claim 1, further comprising, as power consuming portions units other than the data acquisition system:
a table on which an object is loaded;
a table driving device configured to move the table; and
a projector configured to irradiate light for positioning towards the table,
wherein the power controller is configured to control the electric power system in such a manner that electric power of the charge/discharge element is supplied to at least one of the table driving device and the projector.

4. The magnetic resonance imaging apparatus according to claim 3, wherein the power controller is configured to control the electric power system in such a manner that electric power of the charge/discharge element is supplied to at least one power consuming portion of the data acquisition system.

5. The magnetic resonance imaging apparatus according to claim 4, wherein the power controller is configured to control the electric power system in such a manner that electric power of the charge/discharge element is supplied to an RF transmitter that transmits the RF pulse as a power consuming portion of the data acquisition system.

6. The magnetic resonance imaging apparatus according to claim 5, wherein the power controller is configured to control the electric power system so that consumed power of a supply destination of the charge/discharge element is covered with the external electric power when said consumed power is not more than a predetermined value, and control the electric power system so that electric power in excess of the predetermined value is covered with accumulated electric power of the charge/discharge element when said consumed power exceeds the predetermined value.

7. The magnetic resonance imaging apparatus according to claim 3, further comprising:
a regeneration structure configured to convert at least one of friction energy generated when the table driving device puts a brake on the table in motion and potential energy lost from the table moving in a gravitational direction into electrical energy and supply the electrical energy to the charge/discharge element as a charging current.

8. The magnetic resonance imaging apparatus according to claim 1, wherein the data acquisition system includes a gradient magnetic field coil, a gradient magnetic field power supply configured to generate the gradient magnetic field in the imaging region by supplying electric current to the gradient magnetic field coil, and an RF transmitter configured to transmit the RF pulse to the imaging region; and
the power controller is configured to calculate consumed power by acquiring each input power to the gradient magnetic field power supply and the RF transmitter or by acquiring each output power of the gradient magnetic field power supply and the RF transmitter, and control the electric power system according to the consumed power.

9. The magnetic resonance imaging apparatus according to claim 8, further comprising:
a table on which an object is loaded;
a table driving device configured to move the table; and
a projector configured to irradiate light for positioning towards the table,
wherein the table driving device and the projector are configured to use only electric power supplied from the charge/discharge element as source of electrical energy.

10. The magnetic resonance imaging apparatus according to claim 9, wherein the power controller is configured to control the electric power system in such a manner that electric power of the charge/discharge element is supplied to an RF transmitter that transmits the RF pulse as a power consuming portion of the data acquisition system.

11. The magnetic resonance imaging apparatus according to claim 10, further comprising:
a system control unit configured to set conditions of an MRI sequence, and judge practicability of the MRI sequence before performance of the MRI sequence by calculating the consumed power in a case of performing the MRI sequence based on the conditions; and
a display device configured to display information indicative of impracticability, when the system controller judges the MRI sequence to be impracticable.

12. The magnetic resonance imaging apparatus according to claim 1, further comprising:
an RF transmitter configured to be a part of the data acquisition system and transmit the RF pulse;
a static magnetic field magnet configured to be a part of the data acquisition system and generate a static magnetic field in a region including the imaging region;
a cooler configured to cool down the static magnetic field magnet; and
a computer configured to store data of the NMR signal acquired by the data acquisition system and to reconstruct image data based on the NMR signal,
wherein the power controller is configured to control the electric power system in such a manner that electric power from the charge/discharge element is supplied to at least one of the RF transmitter, the cooler and the computer while consumed power of the MRI apparatus is larger than the external electric power.

13. The magnetic resonance imaging apparatus according to claim 12, wherein
the data acquisition system includes a gradient magnetic field coil, and a gradient magnetic field power supply configured to generate the gradient magnetic field in the imaging region by supplying electric current to the gradient magnetic field coil; and
the power controller is configured to calculate consumed power by acquiring each input power to the gradient magnetic field power supply and the RF transmitter or by acquiring each output power of the gradient magnetic field power supply and the RF transmitter, and control the electric power system according to the consumed power.

14. The magnetic resonance imaging apparatus according to claim 1, wherein the power controller is configured to control the electric power system in such a manner that electric power of the charge/discharge element is supplied to at least one power consuming portion of the data acquisition system.

15. The magnetic resonance imaging apparatus according to claim 1, wherein the power controller is configured to control the electric power system in such a manner that electric power of the charge/discharge element is supplied to an RF transmitter that transmits the RF pulse as a power consuming portion of the data acquisition system.

16. The magnetic resonance imaging apparatus according to claim 1, wherein the power controller is configured to control the electric power system so that consumed power of a supply destination of the charge/discharge element is covered with the external electric power when said consumed power is not more than a predetermined value, and control the electric power system so that electric power in excess of the predetermined value is covered with accumulated electric power of the charge/discharge element when said consumed power exceeds the predetermined value.

17. The magnetic resonance imaging apparatus according to claim 1, wherein the power controller is configured to calculate consumed power of the MRI apparatus, and switch power supply situation of at least a part of the data acquisition system to a first condition or a second condition based on consumed power, said first condition being a condition in which either accumulated electric power of the charge/discharge element or the external electric power is supplied, said second condition being a condition in which both of the accumulated electric power and the external electric power are supplied.

18. The magnetic resonance imaging apparatus according to claim 17, wherein the power controller is configured to control discharge and charge of the charge/discharge element in such a manner that the charge/discharge element is charged in a period during which the consumed power is smaller than the external electric power, and switch power supply situation of at least a part of the data acquisition system to the second condition in a period during which the consumed power is larger than the external electric power.

19. The magnetic resonance imaging apparatus according to claim 18, wherein
the data acquisition system includes a gradient magnetic field coil, a gradient magnetic field power supply configured to generate the gradient magnetic field in the imaging region by supplying electric current to the gradient magnetic field coil, and an RF transmitter configured to transmit the RF pulse to the imaging region; and
the power controller is configured to calculate consumed power by acquiring each input power to the gradient magnetic field power supply and the RF transmitter or by acquiring each output power of the gradient magnetic field power supply and the RF transmitter, and control the electric power system in accordance with the consumed power.

20. A power control method of a magnetic resonance imaging (MRI) apparatus that includes a data acquisition system configured to acquire a nuclear magnetic resonance (NMR) signal by performing an MRI pulse sequence with application of a gradient magnetic field and transmission of an RF pulse to an imaging region, the power control method comprising:
charging a charge/discharge element, that is a part of a hybrid electric power system configured with an external electric power source to selectively provide electric power to different power consuming portions of the MRI apparatus; and
controlling the electric power system in such a manner that (a) at least one power consuming portion excluding the data acquisition system is supplied with electric power from the charge/discharge element, and (b) at least one power consuming portion included in the data acquisition system is supplied with a controlled amount of electric power from the charge/discharge element, said controlled amount corresponding to an amount of power consumed in executing an MRI sequence.

* * * * *